(12) United States Patent
Kasuga et al.

(10) Patent No.: US 7,667,171 B2
(45) Date of Patent: Feb. 23, 2010

(54) SOLID-STATE IMAGING DEVICE

(75) Inventors: Shigetaka Kasuga, Osaka (JP); Takumi Yamaguchi, Kyoto (JP); Takahiko Murata, Osaka (JP)

(73) Assignee: Panasonic Corporation, Osaka (JP)

( * ) Notice: Subject to any disclaimer, the term of this patent is extended or adjusted under 35 U.S.C. 154(b) by 455 days.

(21) Appl. No.: 11/571,461

(22) PCT Filed: Jul. 4, 2005

(86) PCT No.: PCT/JP2005/012352
§ 371 (c)(1),
(2), (4) Date: Dec. 29, 2006

(87) PCT Pub. No.: WO2006/004096
PCT Pub. Date: Jan. 12, 2006

(65) Prior Publication Data
US 2008/0061216 A1 Mar. 13, 2008

(30) Foreign Application Priority Data
Jul. 6, 2004 (JP) ............................ 2004/199803

(51) Int. Cl.
*H01L 27/00* (2006.01)
(52) U.S. Cl. .................................... 250/208.1; 348/294
(58) Field of Classification Search .............. 250/208.1; 257/257, 258, 443, E27.133, E27.151, 290–292; 348/281, 294, 297, 302, 308
See application file for complete search history.

(56) References Cited
U.S. PATENT DOCUMENTS
4,547,807 A 10/1985 Mitani et al.
(Continued)

FOREIGN PATENT DOCUMENTS
EP   1067766   1/2001
(Continued)

OTHER PUBLICATIONS
U.S. Appl. No. 11/569,603 to Murata et al., which was filed on Nov. 27, 2006.
(Continued)

*Primary Examiner*—John R Lee
(74) *Attorney, Agent, or Firm*—Greenblum & Bernstein P.L.C.

(57) ABSTRACT

In the case where a subject is captured with a high-luminance light, such as sunlight, for a background, a phenomenon that a portion of the high-luminance subject is detected as a no-signal level is prevented. The solid-state imaging device includes: a photoelectric transducer PD which converts incident light to charges; a voltage level detection circuit 50 in which pixel units 10an1 and 10bn1, each having a voltage conversion amplifying transistor Q13$a$ which outputs a voltage by converting the charges accumulated in the photoelectric transducer PD, are arranged one-dimensionally or two-dimensionally, and which detects a pixel output voltage outputted from each of the pixel units to the common column signal line Ln; and a column signal processing circuit 80 which receives a logic output voltage of the voltage level detection circuit 50 and the pixel output voltage and which outputs a voltage to a horizontal output circuit 90. The column signal processing circuit 80 outputs either a voltage identical to the pixel output voltage or a fixed voltage, depending on the logic output voltage.

13 Claims, 23 Drawing Sheets

U.S. PATENT DOCUMENTS

| | | | |
|---|---|---|---|
| 5,339,106 A * | 8/1994 | Ueno et al. | 348/243 |
| 5,990,948 A * | 11/1999 | Sugiki | 348/250 |
| 6,770,881 B2 * | 8/2004 | Iida et al. | 250/332 |
| 6,963,367 B1 | 11/2005 | Hashimoto | |
| 7,113,213 B2 * | 9/2006 | Matsunaga et al. | 348/308 |
| 7,394,491 B2 | 7/2008 | Bae et al. | |
| 2004/0155973 A1 | 8/2004 | Bae et al. | |
| 2004/0239786 A1 | 12/2004 | Masuyama et al. | |
| 2006/0102827 A1 * | 5/2006 | Kasuga et al. | 250/208.1 |
| 2006/0278948 A1 | 12/2006 | Yamaguchi et al. | |
| 2006/0284052 A1 | 12/2006 | Toshikiyo et al. | |
| 2007/0035721 A1 | 2/2007 | Toshikiyo et al. | |
| 2008/0061216 A1 * | 3/2008 | Kasuga et al. | 250/208.1 |
| 2008/0258045 A1 * | 10/2008 | Oike et al. | 250/208.1 |
| 2008/0284886 A1 * | 11/2008 | Wakabayashi et al. | 348/301 |

FOREIGN PATENT DOCUMENTS

| | | |
|---|---|---|
| EP | 1463306 | 9/2004 |
| JP | 59-000275 | 1/1984 |
| JP | 60-112376 | 6/1985 |
| JP | 61-128681 | 6/1986 |
| JP | 4-330877 | 11/1992 |
| JP | 2001-24949 | 1/2001 |
| JP | 2001-024949 | 1/2001 |
| JP | 2003-046865 | 2/2003 |
| JP | 2000-287131 | 10/2003 |
| JP | 2004-222273 | 8/2004 |
| JP | 2004-312700 | 11/2004 |
| JP | 2005-57612 | 3/2005 |

OTHER PUBLICATIONS

U.S. Appl. No. 11/617,173 to Kuriyama, which was filed on Dec. 28, 2006.

U.S. Appl. No. 11/621,331 to Onozawa et al., which was filed on Jan. 9, 2007.

English language Abstract of JP 2005-57612, Mar. 3, 2005.

English language Abstract of JP 2004-222273, Aug. 5, 2004.

* cited by examiner

SOLID-STATE IMAGING DEVICE

TECHNICAL FIELD

The present invention relates to a solid-state imaging device installed in video cameras, digital cameras, and personal digital assistants (PDA), such as cellular phones and the like, and to a technology which prevents a phenomenon in which, when a high-luminance subject is captured, a portion of the high-luminance subject is detected as a no-signal level or a minus-signal level, instead of a saturation signal level, and a white image comes out as a black image.

BACKGROUND ART

MOS solid-state imaging devices can be broadly divided into two types, an AMI type and a floating diffusion amplifier type (may be referred to as an "FDA type" hereinafter), according to the circuit configuration and the timing when charges accumulated in a pixel unit of a photoelectric transducer PD are detected.

FIG. 1 is a diagram showing a configuration of the AMI type solid-state imaging device.

As shown in FIG. 1, a solid-state imaging device 900 includes; plural pixel units 10an1 and 10an2 which are arranged two-dimensionally (two units in the diagram); plural common column signal lines Lns respectively arranged per column (a line in the diagram); a load transistor Q21a connected to each common column signal line Ln; a sample hold transistor Q31 provided for each common column signal line Ln; plural noise signal elimination circuits 40 which are respectively arranged per column (a circuit in the diagram); and the like.

Each of the pixel units 10an1 and 10an2 includes: a photoelectric transducer PD which converts incident light to charges; a reset transistor Q12 which resets a cathode of the photoelectric transducer PD to a power supply voltage VDD using a RESET pulse; a voltage conversion amplifying transistor Q13a which detects a voltage corresponding to charges of the photoelectric transducer PD; and a row selection transistor Q14 which transfers, to each of the common column signal lines Lns per row, a voltage outputted from the voltage conversion amplifying transistor Q13 using a VSEL pulse.

The sample hold transistor Q31 samples and holds the voltage outputted to the common column signal line Ln using an SH pulse.

The noise signal elimination circuit 40 includes a clamp transistor Q42, a clamp capacitor C41, and a sample hold capacitor C42, and detects a signal component in which a noise component is eliminated, by obtaining a difference between: a reset voltage of the photoelectric transducer PD to be detected in each of the pixel unit 10an1 and 10an2; and a voltage to be detected depending on the charges corresponding to the amount of light.

Next, a charge detection operation of the solid-state imaging device 900 is described. Note that the charge detection operation in the pixel unit 10an1 is described in particular.

FIG. 2 is a diagram showing drive timing of the solid-state imaging device 900 shown in FIG. 1.

At the time t0, all pulses are off.

Next, the VSE pulse turns on the row selection transistor Q14 at the time t0, the SH pulse turns on the sample hold transistor Q31 at the time t2, and a CP pulse turns on the clamp transistor Q42 in the noise signal elimination circuit 40 from the time t3 to t4.

From the time t4 when the CP pulse is turned off to the time t5 when the RESET pulse in the pixel unit 10an1 is turned on, the sample hold capacitor C42 in the noise signal elimination circuit 40 holds the accumulated charges of the photoelectric transducer PD of the pixel unit 10an1 via the voltage conversion amplifying transistor Q13a of the pixel unit 10an1.

A holding signal in this case is assumed to be a voltage A.

From the time t5 to the time t6, after the RESET pulse turns on the reset transistor Q12 and then the photoelectric transducer PD is reset to a power supply voltage VDD level, until the time when the SH pulse turns off the sample hold transistor Q31 at the time t7, the sample hold capacitor C42 of the noise signal elimination circuit 40 again hold the reset level of the photoelectric transducer PD via the voltage conversion amplifying transistor Q13a. The holding signal at this time is assumed to be a voltage B. In the noise signal elimination circuit 40, by obtaining a difference between the previously held voltage A and the subsequently held voltage B, an accumulation signal component is detected which is in a two-dimensional imaging region of the pixel units and in which the noise signal component is eliminated. Next, at the time t8, the VSEL pulse turns off the row selection transistor Q14. With this, the charge detection operation for a row of the photoelectric transducer PD set in the two-dimensional imaging region ends.

FIG. 3 is a diagram showing the configuration of an FDA-type solid-state imaging device.

In this case, a solid-state imaging device 950 includes pixel units 10bn1 and 10bn2 as a replacement for the pixel units 10an1 and 10an2.

Each of the pixel units 10bn1 and 10bn2 further includes a transfer transistor Q11 which reads charges from the photoelectric transducer PD and a floating diffusion FD which temporarily accumulates charges, in addition to the components provided for the pixel units 10an1 and 10an2. In this case, the reset transistor Q12a resets the floating diffusion FD to the power supply voltage VDD, and the voltage conversion amplifying transistor Q13a detects a voltage corresponding to the accumulated charges of the floating diffusion FD.

Next, the charge detection operation of the solid-state imaging device 950 is described. Note that the charge detection operation in the pixel unit 10bn1 is described in particular.

FIG. 4 is a diagram showing drive timing of the solid-state imaging device 950.

At the time t0, all pulses are OFF. Next, the VSEL pulse turns on the row selection transistor Q14 of the pixel unit 10bn1 at the time t1, and the SH pulse turns on the sample hold transistor Q31 at the time t2. From the time t3 to t4, the RESET pulse turns on the reset transistor Q12a. With this, after the floating diffusion FD is reset to the power supply voltage VDD level, from the time t4 when the RESET pulse is turned off to the time t5 when the TRANS pulse turns on the transfer transistor Q11, the sample hold capacitor C42 of the noise signal elimination circuit 40 holds the reset level of the floating diffusion FD via the voltage conversion amplifying transistor Q13a. The holding signal at this time is assumed to be a voltage C.

Next, from the time t5 to the time t6, the TRANS pulse turns on the transfer transistor Q11, and after the accumulated charges of the photoelectric transducer PD are transferred to the floating diffusion FD, until the time t7 when the SH pulse turns off the sample hold transistor Q31, the sample hold capacitor C42 of the noise signal elimination circuit 40 holds the charges accumulated in the floating diffusion FD of the pixel unit 10bn1 via the voltage conversion amplifying transistor Q13a. The holding signal at this time is assumed to be a voltage D. In the noise signal elimination circuit 40, by obtaining a difference between the previously held voltage C and the subsequently held voltage D, an accumulation signal component is detected which is in the two-dimensional imaging region of the pixel units and in which the noise signal component is eliminated. Next, at the time t8, the VSEL pulse turns off the row selection transistor Q14. With this, the charge detection operation for a row of the photoelectric transducer PD set in the two-dimensional imaging region ends.

However, when a subject is captured with a high-luminance light, such as sunlight, for a background, a phenomenon occurs that the aforementioned MOS solid-state imaging device detects a portion of the high-luminance subject not as a saturation signal level but as a no-signal level.

The occurrence mechanism of this phenomenon is described with reference to FIGS. 5 to 9. The pixel unit 10an1 loans used in FIG. 5 and FIG. 6 is categorized as an AMI type. FIG. 5 shows a case where the amount of incident light is reference amount of light, and normal charge detection is performed. FIG. 6 shows a case where the amount of incident light is equal to or more than 200 thousand times as much as the reference amount of light, and abnormal charge detection is performed.

FIG. 5(a) shows a potential diagram of the pixel unit 10an1 from the time t3 to the time t5 shown in FIG. 2.

The noise signal elimination circuit 40 holds the accumulated charges of the photoelectric transducer PD via an voltage conversion amplifier of the pixel unit 10an1. The holding signal at this time is assumed to be the voltage A.

FIG. 5(b) shows a potential diagram of the pixel unit 10an1 from the time t5 to the time t6 shown in FIG. 2. Here, the photoelectric transducer PD is reset to the power supply voltage VDD level.

FIG. 5(c) shows a potential diagram of the pixel unit 10an1 from the time t6 to the time t7 shown in FIG. 2. Here, the level of the photoelectric transducer PD which has been reset to the power supply voltage VDD level is maintained, and is held by the noise signal elimination circuit 40 via the voltage conversion amplifier of the pixel unit 10an1. The holding signal at this time is assumed to be the voltage B. In the noise signal elimination circuit 40, by obtaining a difference between the previously held voltage A and the subsequently held voltage B, an accumulation signal component can be detected which is in the two-dimensional imaging region of the pixel units and in which the noise signal component is eliminated.

FIG. 6(a) shows a potential diagram of the pixel unit 10an1 from the time t3 to the time t5 shown in FIG. 2. Here, the noise signal elimination circuit 40 holds the accumulated charges of the photoelectric transducer PD via a voltage conversion amplifier of the pixel unit 10an1, The holding signal at this time is assumed to be the voltage A.

FIG. 6(b) shows a potential diagram of the pixel unit 10an1 from the time t5 to the time t6 shown in FIG. 2. Here, the photoelectric transducer PD is reset to the power supply voltage VDD level.

FIG. 6(c) shows a potential diagram of the pixel unit 10an1 from the time t6 to the time t7 shown in FIG. 2. Here, the level of the photoelectric transducer PD which has been reset to the power supply voltage VDD level can not be maintained. In the case where the amount of incident light is equal to or more than 200 thousand times as much as the reference amount of light, immediately after the photoelectric transducer PD is reset to the power supply voltage VDD level, in other words, immediately after the time t6 when the RESET pulse of the pixel unit 10an1 is turned off, the large amount of charges is accumulated in the photoelectric transducer PD. Thus, the voltage level identical to the level when the accumulated charges become saturated is held by the noise signal elimination circuit 40 via the voltage conversion amplifier of the pixel unit 10an1. In this case, assuming that the holding signal is the voltage B, a difference between the previously held voltage A and the subsequently held voltage B becomes 0 or minus in the noise signal elimination circuit 40. As a result, the accumulation signal component can not be detected which is in the two-dimensional imaging region of the pixel units and in which the noise signal component is eliminated.

The pixel unit 10bn1 described in FIG. 7 and FIG. 8 is categorized as an FDA type. FIG. 7 shows a case where the amount of incident light is the reference amount of light, and the normal charge detection is performed. FIG. 8 shows a case where the amount of incident light is equal to or more than 200 thousand times as much as the reference amount of light intensity, and the abnormal charge detection is performed.

FIG. 7(a) shows a potential diagram of the pixel unit 10bn1 from the time t3 to the time t5 shown in FIG. 4. Here, the RESET pulse of the pixel unit 10bn1 turns on the reset transistor Q12a. With this, a charge detection unit (floating diffusion) of the pixel unit 10bn1 is reset to the power supply voltage VDD level.

FIG. 7(b) shows a potential diagram of the pixel unit 10bn1 from the time t4 to the time t5 shown in FIG. 4. Here, the charge detection unit (floating diffusion) of the pixel unit 10bn1 which has been reset to the power supply voltage VDD level is maintained, and is held by the noise signal elimination circuit 40 via the voltage conversion amplifying transistor Q13a of the pixel unit 10bn1. The holding signal at this time is assumed to be the voltage C.

FIG. 7(c) shows a potential diagram of the pixel unit 10bn1 from the time t5 to the time t7 shown in FIG. 4.

After the accumulated charges of the photoelectric transducer PD are transferred to the charge detection unit (floating diffusion), the level is maintained. Until the time t7 when the SH pulse turns off the sample hold transistor Q31, the noise signal elimination circuit 40 holds the charges accumulated in the charge detection unit (floating diffusion) of the pixel unit 10bn1 via the voltage conversion amplifying transistor Q13a. The holding signal at this time is assumed to be the voltage D.

In the noise signal elimination circuit 40, by obtaining a difference between the previously held voltage C and the subsequently held voltage D, the accumulation signal component can be detected which is in the two-dimensional imaging region of the pixel units and in which the noise signal component is eliminated.

FIG. 8(a) shows a potential diagram of the pixel unit 10bn1 from the time t3 to the time t4 shown in FIG. 4. Here, the RESET pulse turns on the reset transistor Q12a. With this, the charge detection unit (floating diffusion) of the pixel unit 10bn1 is reset to the power supply voltage VDD level.

FIG. 8(b) shows a potential diagram of the pixel unit 10bn1 from the time t4 to the time t5 shown in FIG. 4. Here, the charge detection unit (floating diffusion) of the pixel unit 10bn1 which has been reset to the power supply voltage VDD level can not be maintained. In the case where the amount of incident light is equal to or more than 200 thousand times as much as the reference amount of light, with the parasitic NPN configuration as shown in FIG. 9, the potential in the photoelectric transducer PD region is significantly lowered, and a path where a current flows is generated from the charge detection unit (floating diffusion). With this, even when the TRANS pulse is turned off, the potential is lowered in the charge detection unit (floating diffusion) of the pixel unit 10bn1, and consequently, the noise signal elimination circuit 40 holds, via the voltage conversion amplifying transistor Q13a, the voltage level equal to or more than the level when the accumulated charges become saturated. The holding signal at this time is assumed to be the voltage C.

FIG. 8(c) shows a potential diagram of the pixel unit 10bn1 from the time t5 to the time t7 shown in FIG. 4. Here, even when the TRANS pulse of the pixel unit 10bn1 turns on the transfer transistor Q11, since the accumulated charges, equal to or more than the level when the accumulated charges become saturated, have flown from the photoelectric transducer PD in advance, the voltage level of the charge detection unit (floating diffusion) of the pixel unit 10bn1 is lowered. Consequently, the noise signal elimination circuit 40 holds this voltage level via the voltage conversion amplifying transistor Q13a of the pixel unit 10bn1. Assuming that this holding signal is the voltage D, a difference between the previously held voltage C and the subsequently held voltage D becomes 0 or minus. As a result, the accumulation signal component can not be detected which is in the two-dimensional imaging region of the pixel units and in which the noise signal component is eliminated (refer to Patent Reference 1).

As a method of solving this phenomenon, a method which detects a pixel output signal in a signal processing circuit and corrects it is suggested (refer to Patent Reference 2).

When a subject is captured with a high-luminance light, such as sunlight, for a background, a conventionally suggested correction method is to temporarily transfer an output signal generated immediately after a photoelectric transducer PD or a charge detection unit is reset to a comparator in a signal processing circuit and then to judge whether or not high-luminance light is entered using the voltage.

Patent Reference 1: Japanese Laid-Open Patent Application No. 2003-46865 (Pages 1-8, FIG. 1)

Patent Reference 2: Japanese Laid-Open Patent Application No. 2000-287131 (Pages 1-16, FIG. 1)

DISCLOSURE OF INVENTION

Problems That Invention Is To Solve

However, this method is subject to voltage variations generated when a photoelectric transducer PD or a charge detection unit is reset due to variations in threshold values of a transistor, which inevitably arise in a manufacturing process. For example, the reset voltage needs to be first screened per lot, and then the judgment criteria need to be set in the comparator of the signal processing circuit.

Furthermore, a photoelectric transducer PD or a charge detection unit is reset during a horizontal blanking period which is a limited period, and immediately after that, in order to detect an output signal level, a very high speed processing is required. In particular, when a subject is captured in high-speed continuous-exposure mode, no sufficient lead time is allowed to correct the captured multiple pixel images, and no normal correction can be made.

The present invention has been conceived in view of the aforementioned problems, and the object is to provide a MOS solid-state imaging device which normally detects a portion of a high-luminance subject as a saturation signal level and which generates a natural image, using a correction circuit: which can follow variations in threshold values of a transistor, which inevitably arise in a manufacturing process; which can correct the variations in real time even when a subject is captured in high-speed continuous-exposure mode to generate the multiple pixel images; and which does not need to be transferred to another circuit or device for processing a signal, since the correction circuit is configured of a comparatively simple circuit which can be incorporated into a solid-state imaging device on a unit basis.

Means To Solve The Problems

In order to solve the aforementioned problems, the solid-state imaging device according to the present invention includes: pixel units which are arranged one-dimensionally or two-dimensionality; a voltage level detection unit that detects a pixel output voltage outputted from each of the pixel units to a common column signal line; and a column signal processing unit that outputs a predetermined voltage to a horizontal output unit, based on a logic output voltage and the pixel output voltage of the voltage level detection unit; wherein the column signal processing unit outputs, depending on the logic output voltage, one of a voltage corresponding to the pixel output voltage and a fixed voltage.

With this, it becomes possible to immediately judge an output signal level of each of the pixel units within the solid-state imaging device and to correct a signal generated when high-luminance incident light is entered. Furthermore, the high-speed correction processing by another signal processing circuit is not necessary.

Furthermore, according to the solid-state imaging device of the present invention, each of the pixel units can include: a photoelectric transducer that converts incident light into charges; and an amplification unit that outputs a voltage corresponding to the charges accumulated in the photoelectric transducer.

With this, it becomes possible to prevent the pixel output voltage outputted from each of the pixel units to the common column signal line from being attenuated by a load, such as a parasitic capacitor.

Furthermore, according to the solid-state imaging device of the present invention, it is possible that the column signal processing unit includes a noise signal elimination unit that receives the pixel output voltage as an input and outputs a voltage to the horizontal output unit, and the noise signal elimination unit outputs a difference between the pixel output voltage generated when each of the pixel units is reset and the pixel output voltage generated when charges are accumulated in each of the pixel units.

With this, it becomes possible to eliminate the noise in each of the pixel units included in the pixel output signal outputted from each of the pixel units to the common column signal line, by the correlated double sampling performed by the noise signal elimination unit.

Furthermore, according to the solid-state imaging device of the present invention, the column signal processing unit further includes a voltage control unit, and can input a predetermined reset voltage from the voltage control unit to the noise signal elimination unit, instead of the pixel output voltage generated when each of the pixel units is reset, in the case where the column signal processing unit outputs the fixed voltage.

With this, it is possible to forcibly set the pixel output voltage which is generated when the pixel unit is reset and which is not set on the common column signal line when high-luminance incident light is entered, and to normally detect, through the noise signal elimination unit, a difference between the voltage generated when each of the pixel units is reset and the voltage generated when charges are accumulated.

Furthermore, according to the solid-state imaging device of the present invention, the voltage control unit can include: a reset voltage generation unit that generates a voltage identical to the output voltage generated when each of the pixel units is reset; and a replacement unit that recreates a state in which each of the pixel units is reset, by inputting the reset voltage to the common column signal line, the reset voltage being generated by the reset voltage generation unit.

With this, as the reset voltage generation unit is configured of a circuit having the identical transistor used within the same device, the potential identical to the reset voltage in each of the pixel units can be accurately generated, regardless of variations in threshold values of a transistor caused by a manufacturing process. Thus, it is possible to improve the correction accuracy.

Furthermore, according to the solid-state imaging device of the present invention, it is possible that the reset voltage generation unit is formed outside each of the pixel units, and the replacement unit is provided per common column signal line.

With this, it becomes possible to judge an output voltage of a photoelectric transducer per column signal line, and to accurately and immediately correct only the column signal in which high-luminance light is inputted.

Furthermore, according to the solid-state imaging device of the present invention, it is possible that the voltage control unit sets, as an operation period, a period of detecting charges from each of the pixel units to the noise signal elimination unit during a horizontal blanking period, and sets, as a non-operation period, a period other than the aforementioned operation period.

With this, it is possible to substantially reduce the current to be consumed in a correction circuit.

Furthermore, according to the solid-state imaging device of the present invention, it is possible that each of the pixel units includes a floating diffusion, and the reset voltage is used as a voltage when the floating diffusion is reset.

With this, in an FDA-type solid-state imaging device which can provide high-resolution images, it is possible to forcibly set the voltage which is generated when the pixel unit is reset and which is not set on the common column signal line when high-luminance incident light is entered, and to normally detect potential variations of each of the pixel units.

Furthermore, according to the solid-state imaging device of the present invention, the column signal processing unit further includes a voltage control unit, and can output a predetermined saturation voltage from the voltage control unit to the horizontal output unit, in the case where the column signal processing unit outputs the fixed voltage.

With this, even in the case where the voltage is not set which is generated when the pixel unit is reset and which is set on the common column signal line when high-luminance incident light is entered, it is possible to forcibly set the saturation voltage in an output unit of the noise signal elimination unit, in other words, an input unit of the horizontal output unit.

Note that in the case where the predetermined saturation voltage is set as the voltage identical to the input voltage of the horizontal output unit when charges are accumulated in the pixel unit, it becomes possible to set and correct a voltage close to the voltage set in the output unit of the noise signal elimination unit, in other words, the input unit of the horizontal output unit.

Furthermore, according to the solid-state imaging device of the present invention, it is possible that the voltage control unit sets, as an operation period, a period of detecting charges from each of the pixel units to the noise signal elimination unit during a horizontal blanking period, and sets, as a non-operation period, a period other than the aforementioned operation period With this, it is possible to substantially reduce the current to be consumed in a correction circuit.

Furthermore, according to the solid-state imaging device of the present invention, it is possible that each of the pixel units includes a floating diffusion, and the saturation voltage is used as a voltage when the floating diffusion becomes saturated.

With this, in the floating diffusion amplifier type which can provide high-resolution images, the voltage level detection unit can judge whether or not high-luminance incident light is entered by comparing the pixel output voltage with the voltage from the saturation voltage generation unit which generates a voltage identical to the pixel output voltage when charges are accumulated in the floating diffusion.

Furthermore, according to the solid-state imaging device of the present invention, it is possible that the voltage level detection unit includes: a saturation voltage generation unit that generates a voltage identical to the pixel output voltage generated when the accumulated charges become saturated in each of the pixel units; and a judgment unit that compares, with the pixel output voltage, a saturation voltage generated by the saturation voltage generation unit.

With this, as the saturation voltage generation unit is configured of a circuit having the identical transistor used within the same device, the voltage identical to the saturation voltage in each of the pixel units can be accurately generated, regardless of variations in threshold values of a transistor caused by a manufacturing process. Thus, it is possible to judge immediately and accurately whether or not high-luminance incident light is entered in the pixel unit.

Furthermore, according to the solid-state imaging device of the present invention, it is possible that the saturation voltage generation unit is formed outside each of the pixel units, and the judgment unit is provided per common column signal line.

With this, it becomes possible to judge an output voltage of a photoelectric transducer per column signal line, and to immediately and accurately correct only the column signal in which high-luminance light is inputted.

Note that the present invention can be implemented not only as such solid-state imaging device but also as a camera including such solid-state imaging device.

With this, it becomes possible to immediately judge an output signal of a photoelectric transducer and realize a camera which can correct signals generated when high-luminance incident light is entered. cl Effects Of The Invention According to the present invention, it is possible to provide a MOS solid-state imaging device which normally outputs a portion of a subject having a high-luminance light as a saturation signal level and which generates a natural image with an accurate luminance, using a correction circuit: which can correct, in real time, a phenomenon in which, when a subject with a high-luminance light, such as sunlight, for a background, a portion of the subject having the high-luminance light is detected as a no-signal level, instead of a saturation signal level, even when a subject is captured in high-speed continuous-exposure mode to generate the multiple pixel images without being affected by variations in threshold values of a transistor, which inevitably arise in a manufacturing process; and which does not need to be transferred to another circuit or device for processing a signal, since the correction circuit is configured of a comparatively simple circuit which can be incorporated into a solid-state imaging device on a unit basis.

Thus, the present invention can be applied broadly to capturing of still images and even moving images for preventing a phenomenon in which a subject is captured as a black image, instead of a white image, and the practical value of the present

Figure 1:
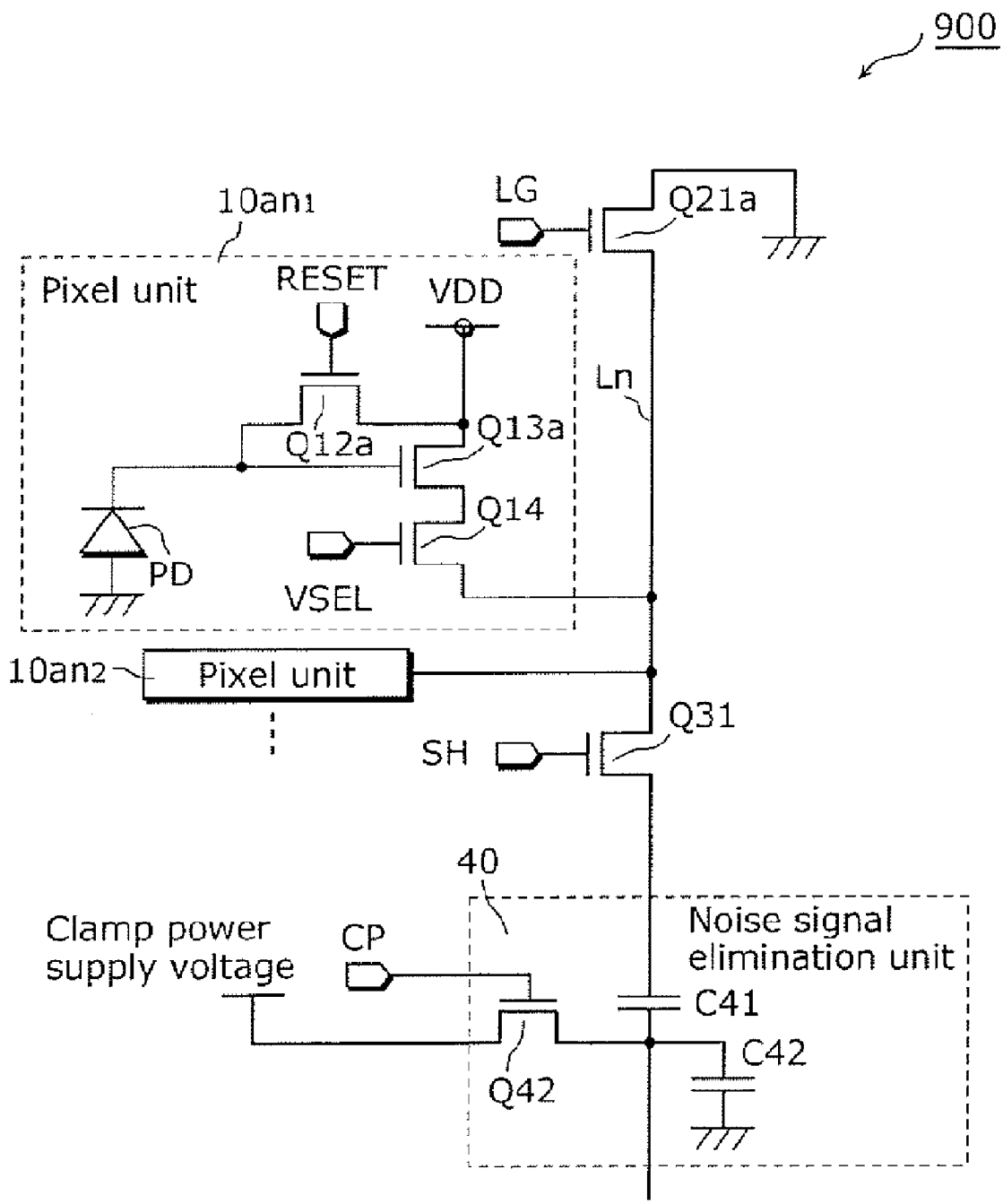
FIG. 1 is a diagram showing a configuration of an AMI type solid-state imaging device.
Figure 2:
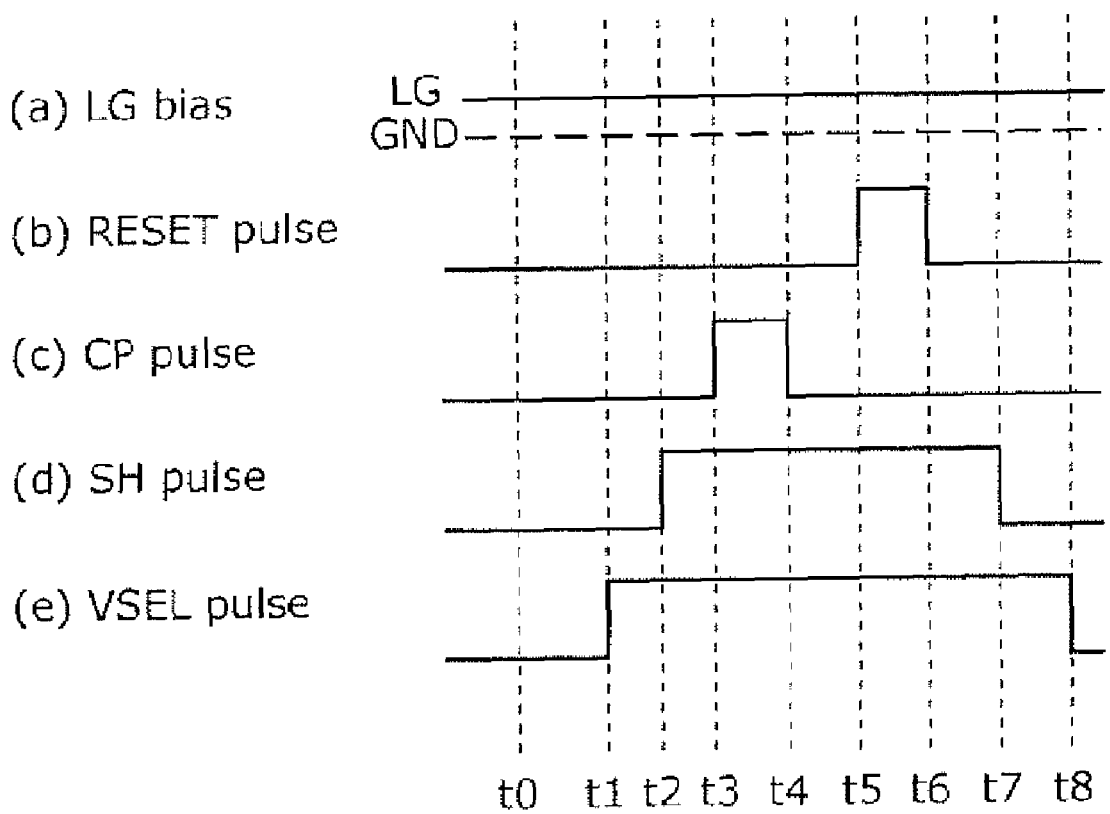
FIG. 2 is a diagram showing drive timing of the solid-state imaging device 900 shown in FIG. 1.
Figure 3:
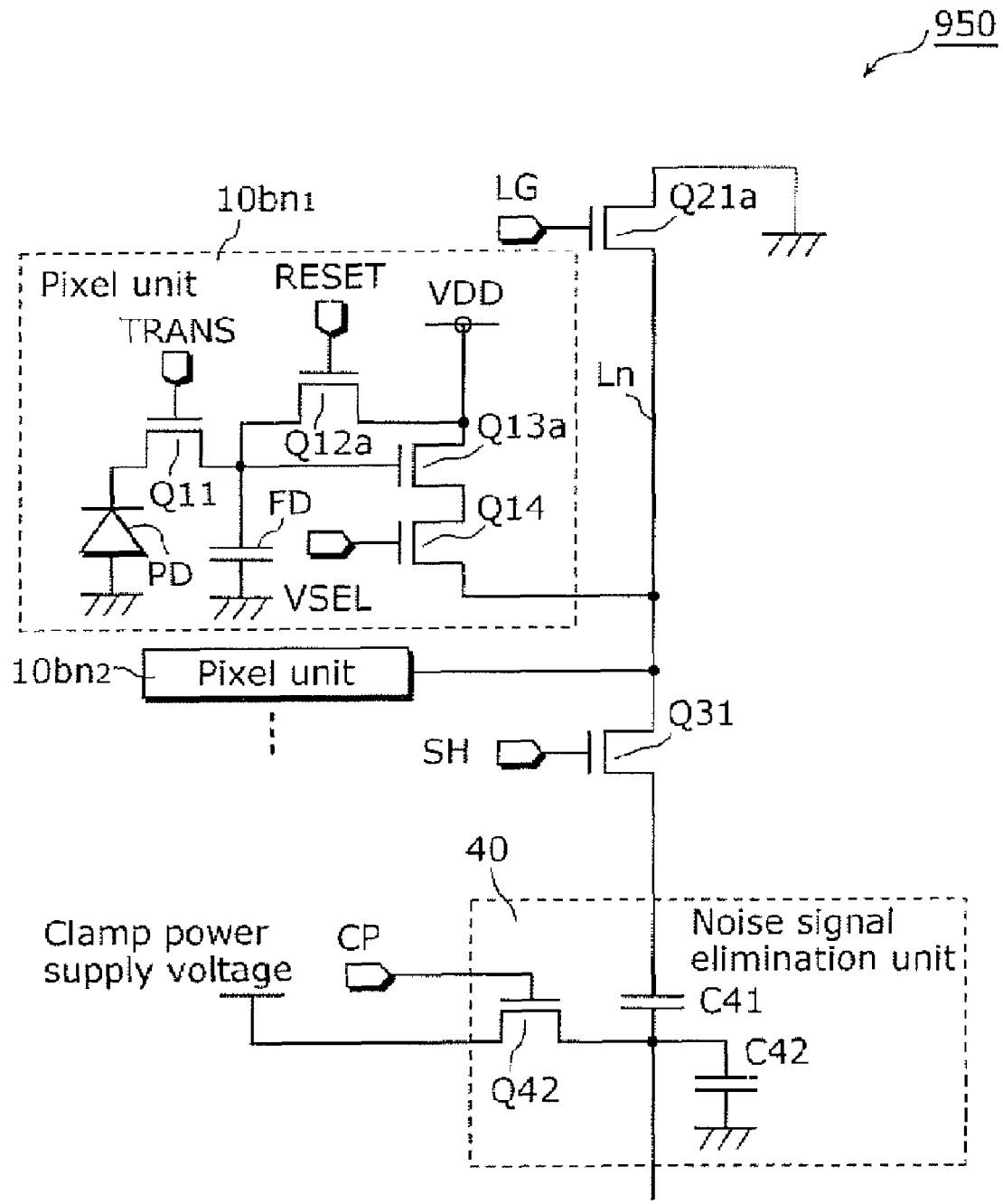
FIG. 3 is a diagram showing a configuration of an FDA-type solid-state imaging device.
Figure 4:
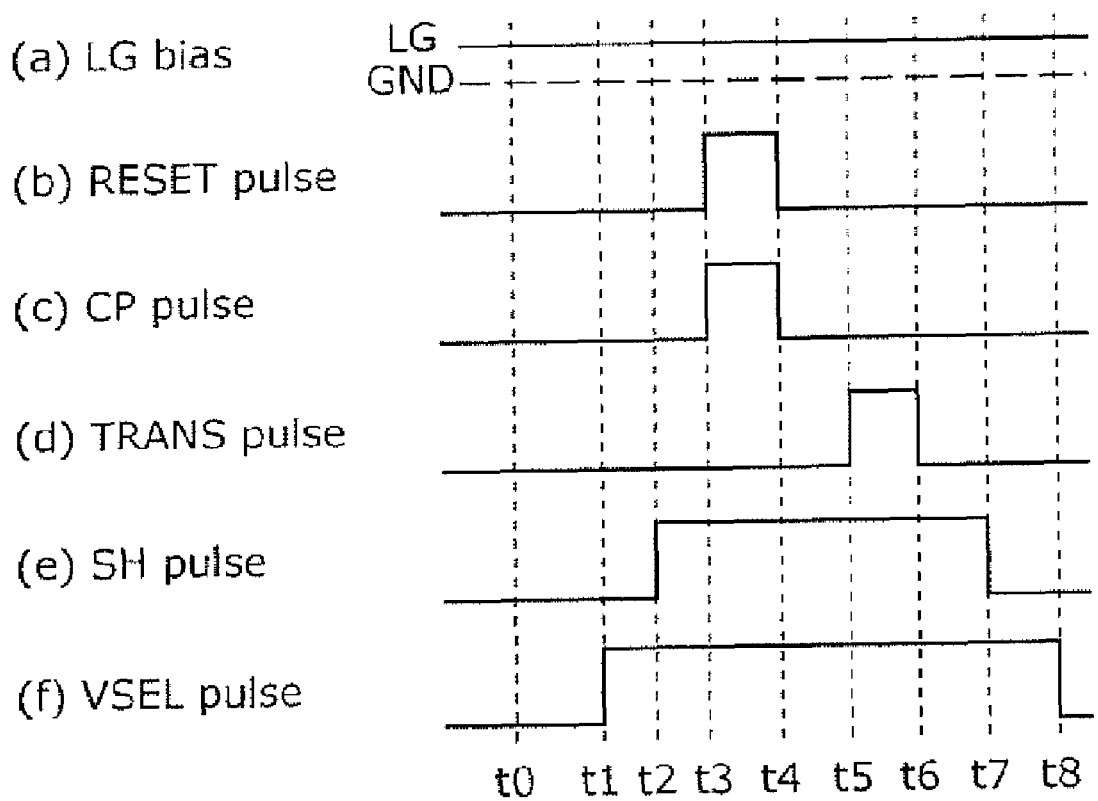
FIG. 4 is a diagram showing drive timing of the solid-state imaging device 950 shown in FIG. 3.
Figure 5:
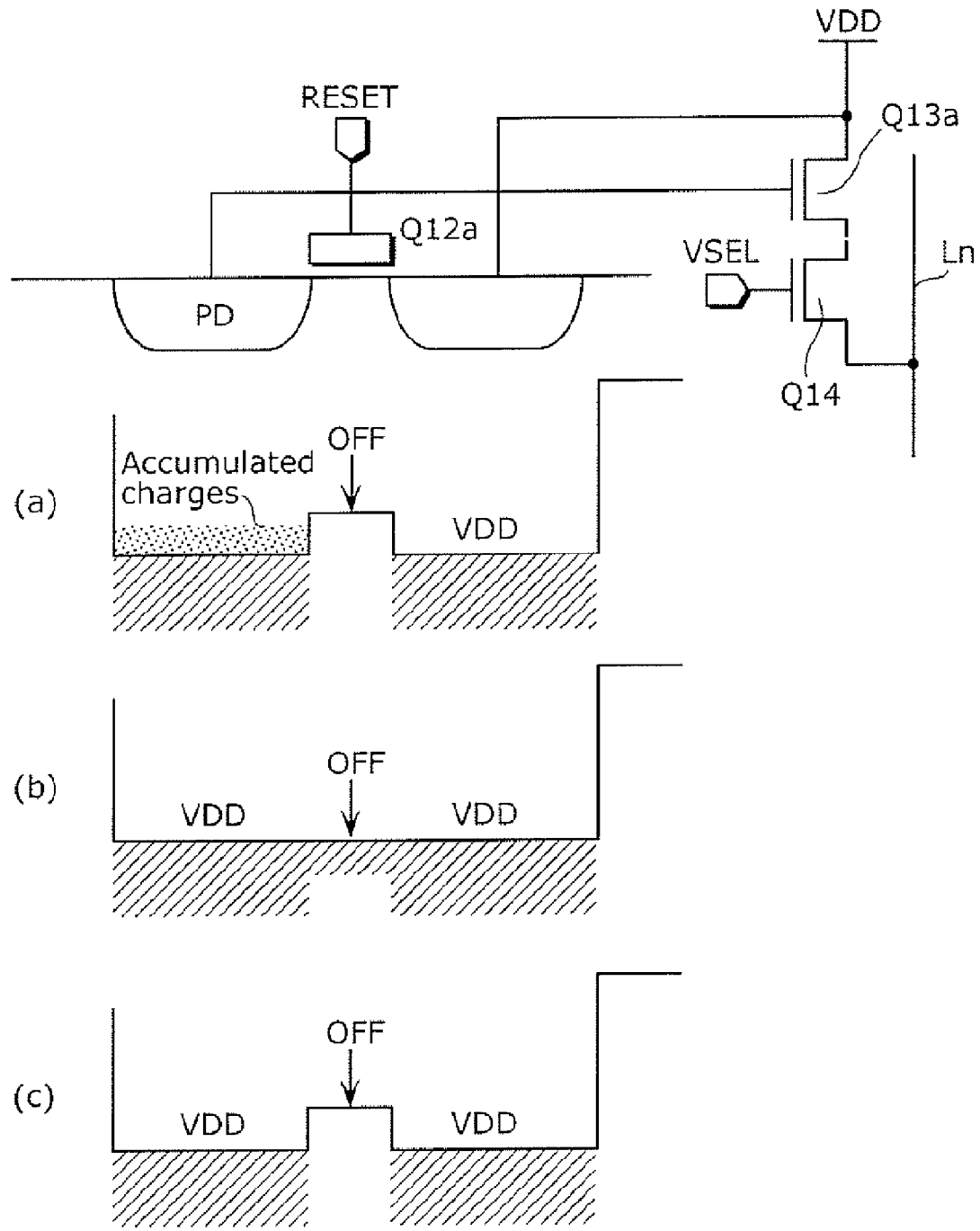
FIG. 5 is a potential diagram of the solid-state imaging device 900 when operating normally.
Figure 6:
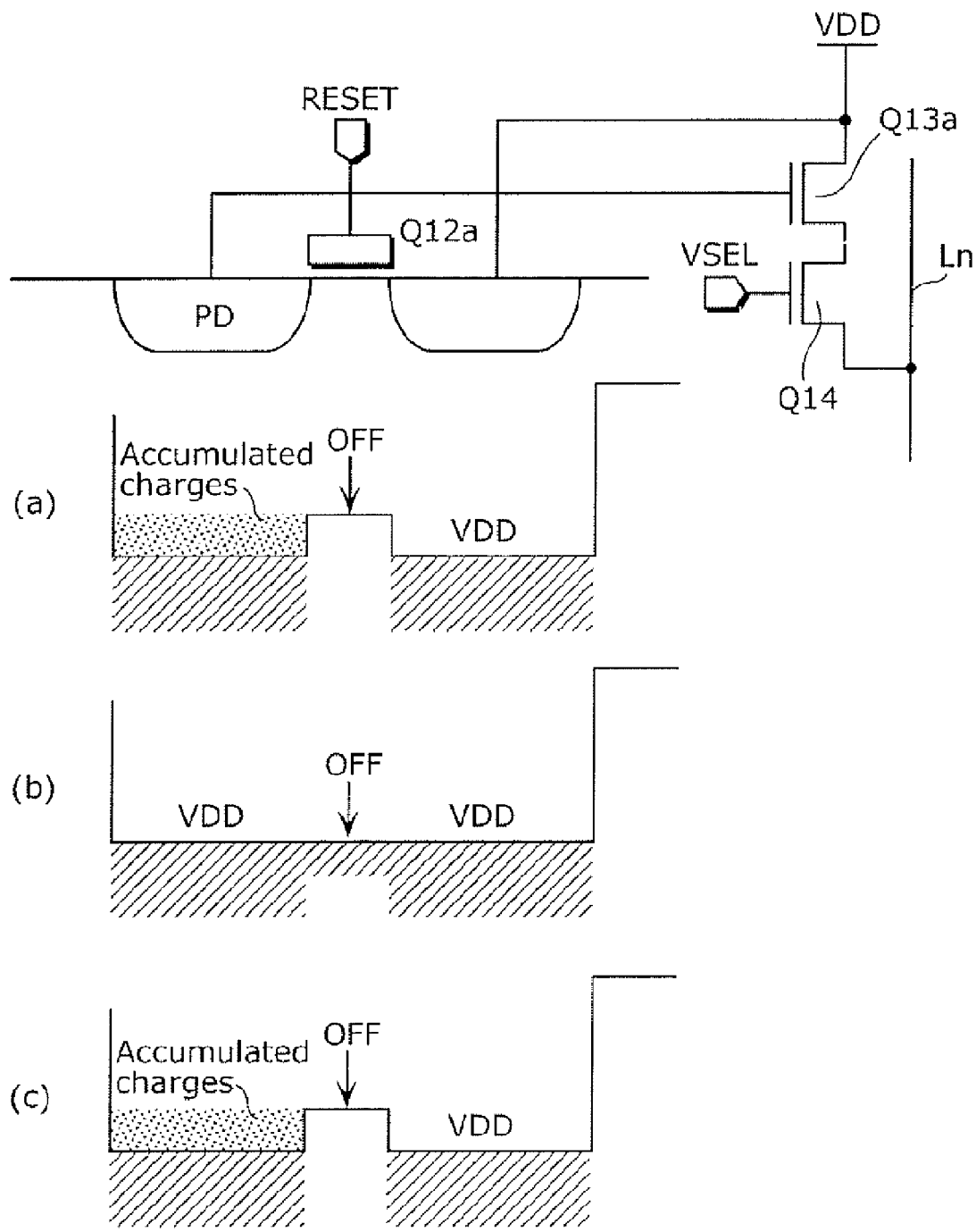
FIG. 6 is a potential diagram of the solid-state imaging device 900 when high-luminance incident light is entered.
Figure 7:
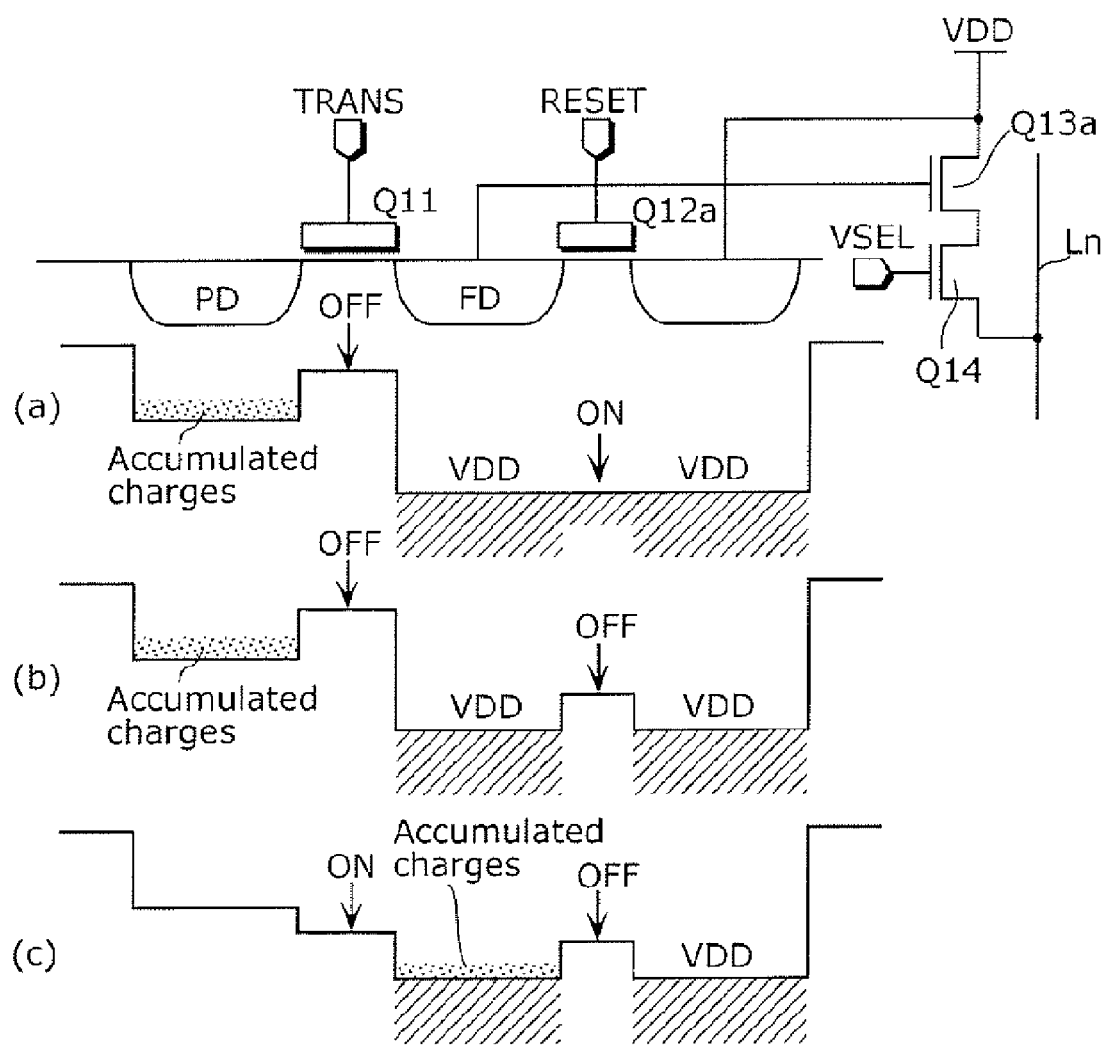
FIG. 7 is a potential diagram of the solid-state imaging device 950 when operating normally.
Figure 8:
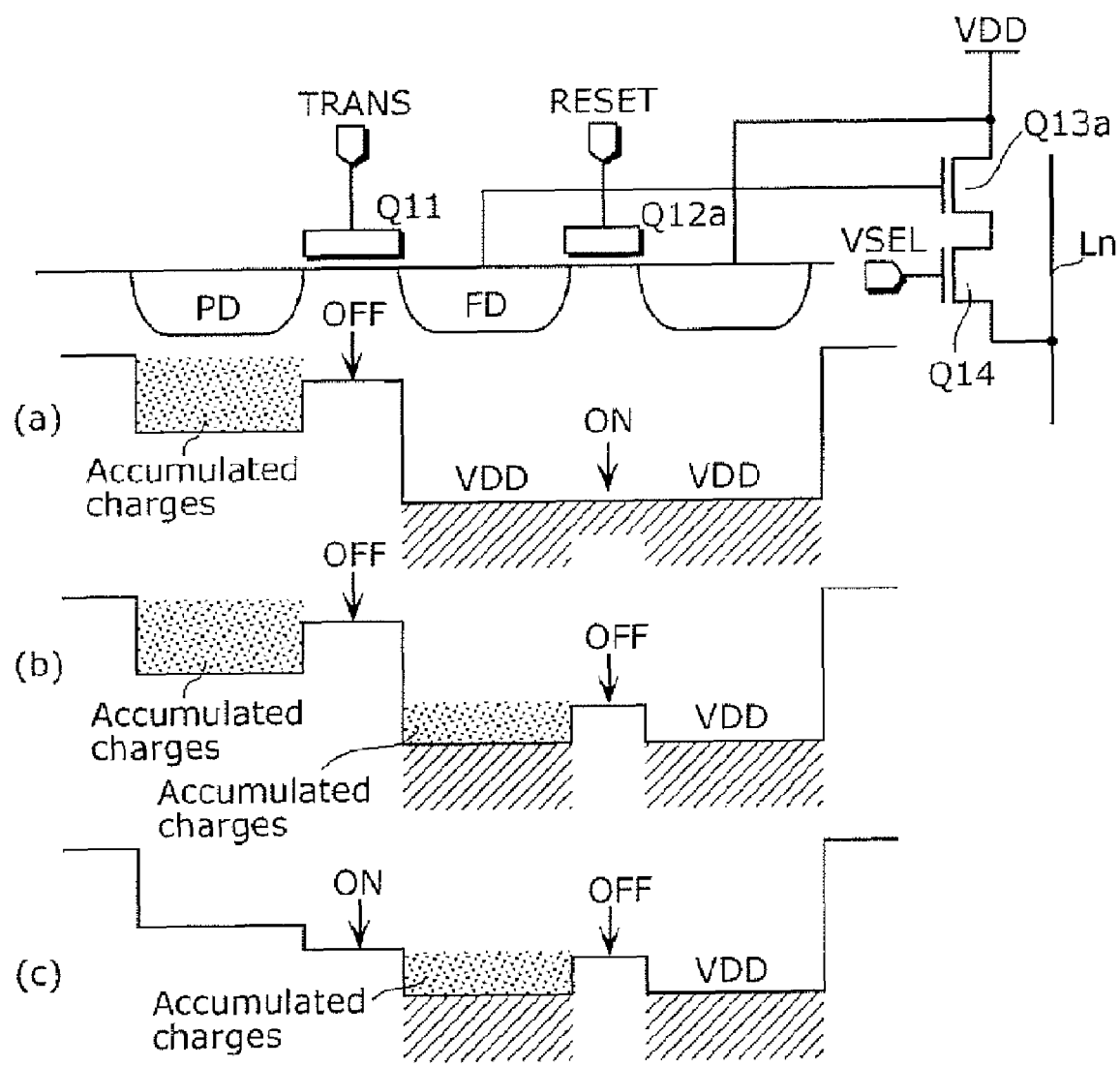
FIG. 8 is a potential diagram of the solid-state imaging device 950 when high-luminance incident light is entered.
Figure 9:
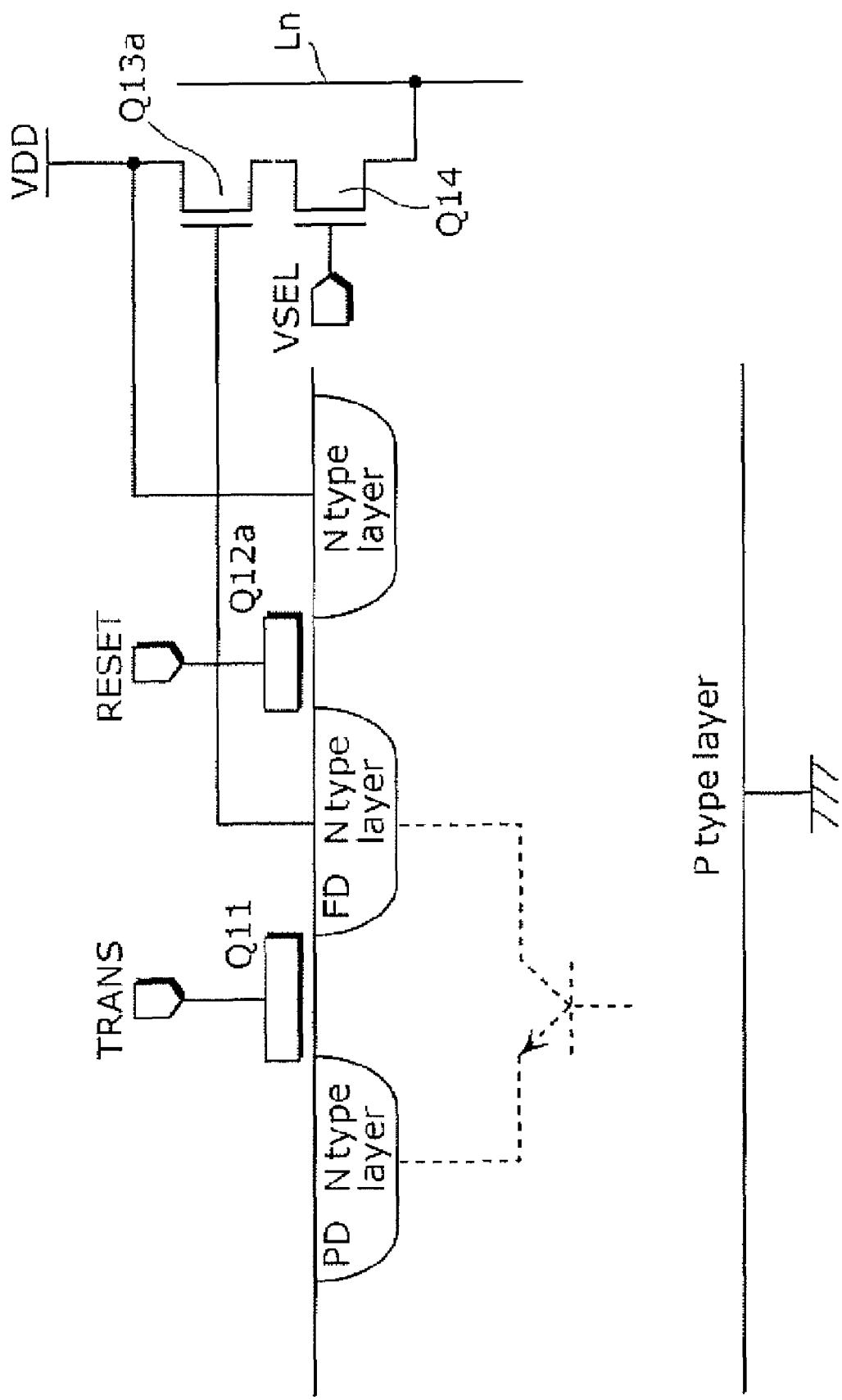
FIG. 9 is a diagram showing a parasitic NPN configuration of the solid-state imaging device 950.

NUMERICAL REFERENCES 1-7 MOS solid-state imaging device
10an1, 10an2, 10bn1, 10bn2 Pixel unit
40 Noise signal elimination circuit
50 Voltage level detection circuit
60 Voltage control circuit
70 Saturation level correction signal
80 Column signal processing circuit
90 Horizontal output circuit
C41 Clamp capacitor
C42 Sampling capacitor
FD Floating diffusion
Ln Common column signal line
Ls Correction signal line
PD Photoelectric transducer
Q11 Transfer transistor
Q12a Reset transistor
Q13a Voltage conversion amplifying transistor
Q14 Row selection transistor
Q21a Load transistor
Q31 Sample hold transistor
Q42 Clamp transistor
Q51a Saturation voltage generation reset transistor
Q51b GND level setting transistor
Q52 Voltage control circuit input unit reset transistor
Q61 Common column signal line connection transistor
Q64 Current reduction transistor
Q65 Current reduction transistor
Q62 Correction signal line connection transistor
Q63 Saturation level correction signal transfer transistor

BEST MODE FOR CARRYING OUT THE INVENTION

The embodiments of the present invention are described hereinafter with reference to the diagrams.

FIRST EMBODIMENT

Figure 10:
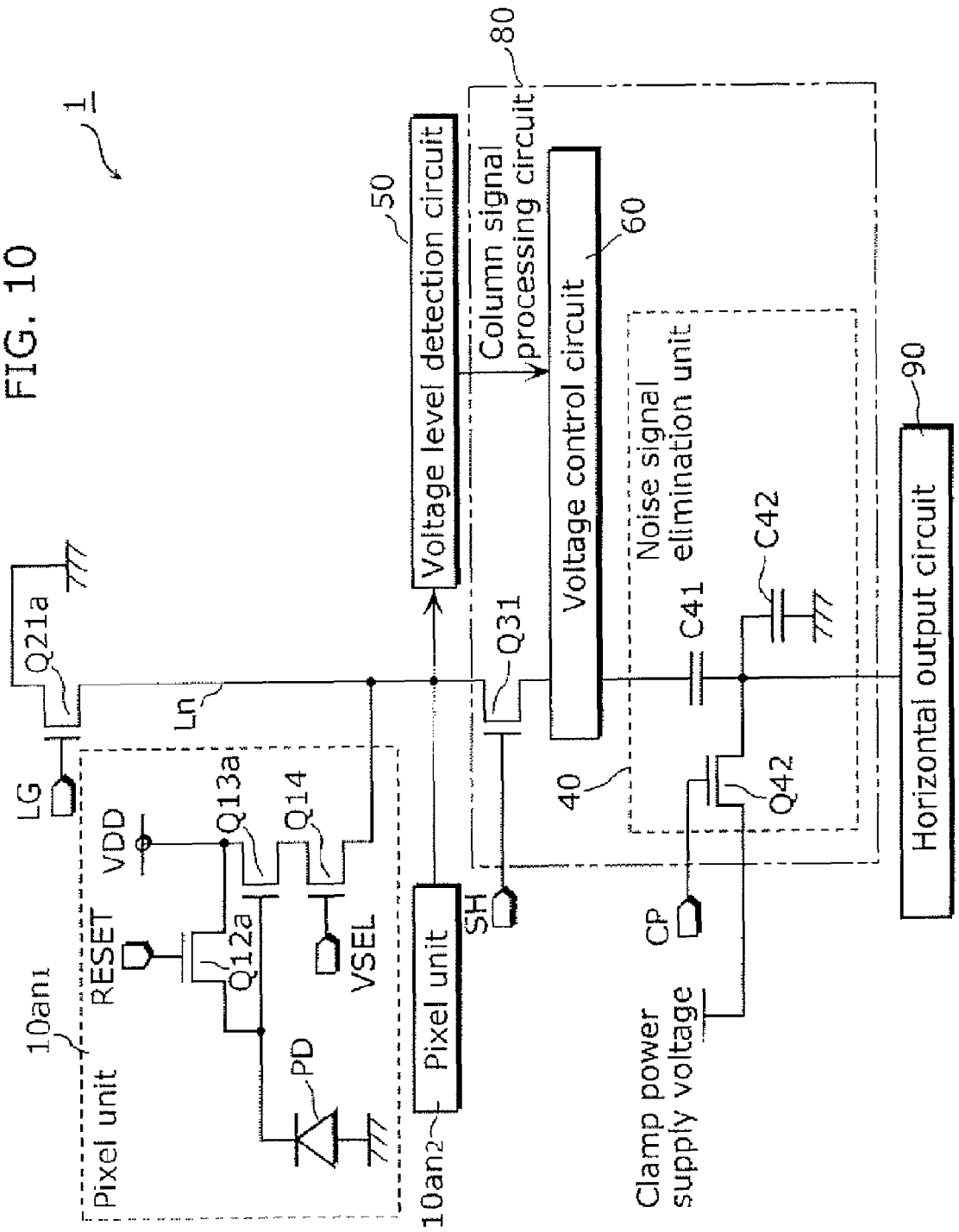
FIG. 10 shows the MOS solid-state imaging device 1 according to the first embodiment of the present invention.

FIG. 10 is a circuit schematic diagram of a solid-state imaging device according to the first embodiment of the present invention.

As shown in FIGS. 10, the MOS solid-state imaging device 1 according to the first embodiment of the present invention further includes a voltage level detection circuit 50, a voltage control circuit 60, and a horizontal output circuit 90, in addition to the configuration of the solid-state imaging device 900 which includes: the plural pixel units 10an1 and 10an2 which are arranged two-dimensionally (two units in the diagram); the plural common column signal lines Lns arranged per column (a line in the diagram); the load transistor Q21a connected to each common column signal line Ln; the sample hold transistor Q31 provided for each common column signal line Ln; and the plural noise signal elimination circuits 40 which are respectively arranged per column (a circuit in the diagram).

The voltage level detection circuit 50 detects a voltage outputted from the voltage conversion amplifying transistor Q13a to the common column signal line Ln.

The voltage control circuit 60 directly controls the voltage outputted to the common column signal line Ln, using a signal from the voltage level detection circuit 50. More specifically, the voltage control circuit 60 controls the voltage of the common column signal line Ln according to the logic level outputted as a result of the comparison in the voltage level detection circuit 50, so as to set it to the voltage outputted from the voltage conversion amplifying transistor Q13a or to replace it with a predetermined voltage.

Note that a column signal processing circuit 80 is configured of the sample hold transistor Q31, the noise signal elimination circuit 40, and the voltage control circuit 60.

In the case where the predetermined voltage is identical to the voltage generated when the photoelectric transducer is reset, it is possible to forcibly set the voltage which is generated when the photoelectric transducer is reset and which is not set on the common column signal line when high-luminance incident light is entered, and to normally detect potential variations of the photoelectric transducer.

Figure 11:
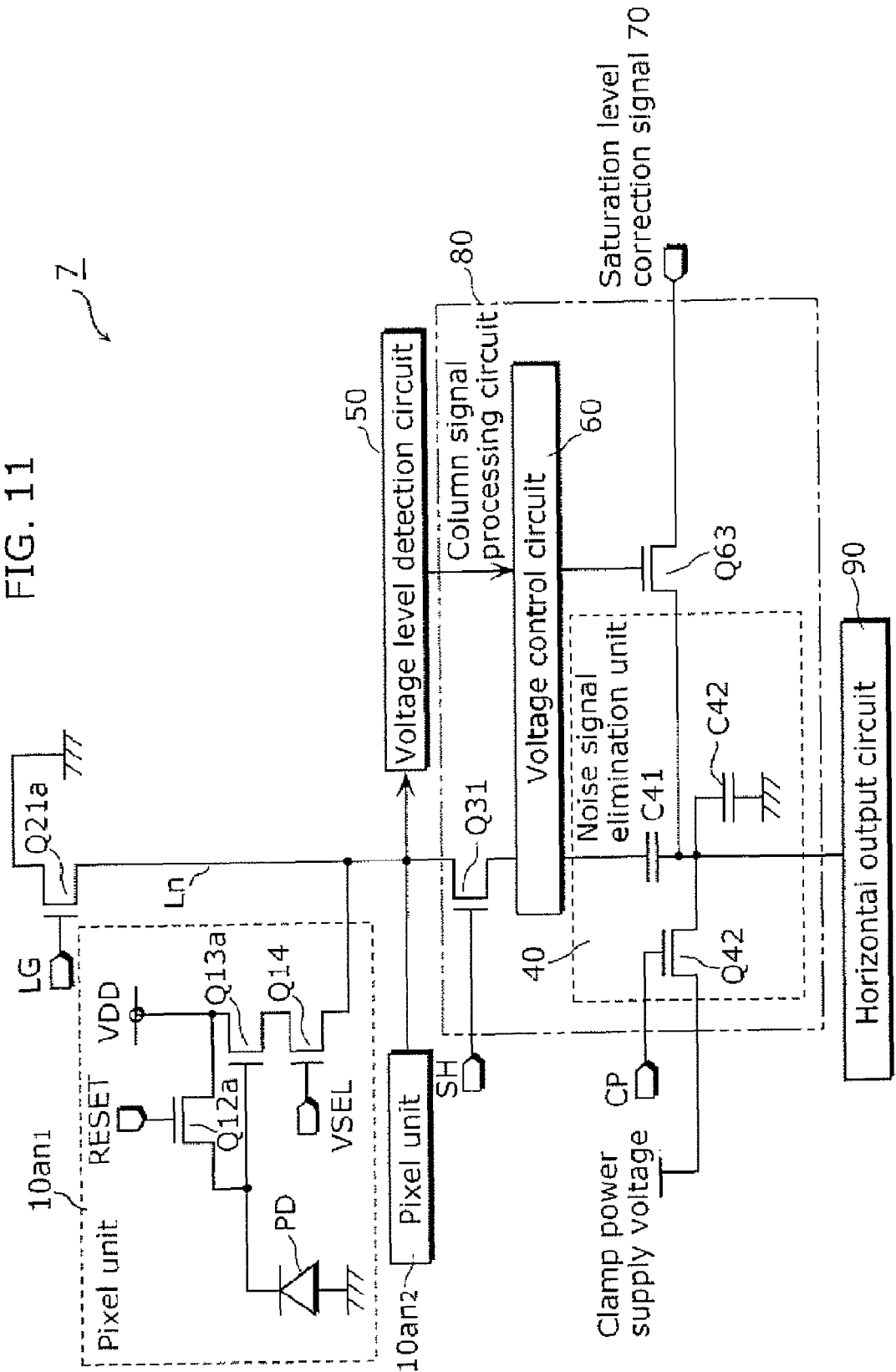
FIG. 11 shows the MOS solid-state imaging device 7 according to the first embodiment of the present invention.

Note that in a MOS solid-state imaging device 7 shown in FIG. 11, a predetermined voltage is an output voltage of the noise signal elimination unit which is generated when charges accumulated in the photoelectric transducer become saturated, in other words, a voltage corresponding to an input to the horizontal output circuit 90. Even when the voltage is not set which is generated when the photoelectric transducer is reset and which is set on the common column signal line when high-luminance incident light is entered, by forcibly inputting a saturation level correction signal 70 in an output unit of the noise signal elimination unit via a saturation level correction signal transfer transistor Q63, it becomes possible to set and correct the voltage which is outputted from the noise signal elimination unit and generated when the accumulated charges in the pixel unit become saturated.

Figure 12:
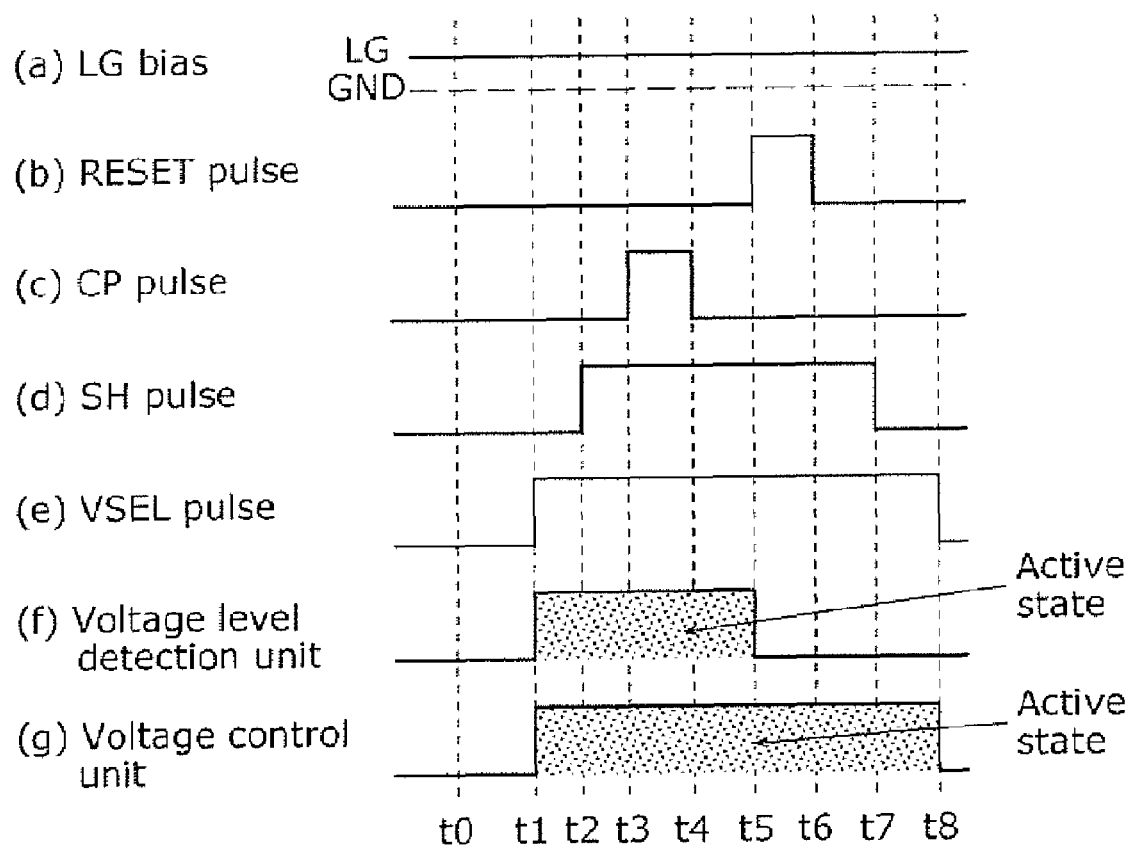
FIG. 12 is a diagram showing drive timing of the MOS solid-state imaging devices 1 and 7.

FIG. 12 is a diagram showing drive timing of the MOS solid-state imaging devices 1 and 7.

This timing diagram shows an example of the timing when the voltage level detection circuit 50 and the voltage control circuit 60 become active in the case where the charges accumulated in the AMI-type photoelectric transducer of the pixel unit 10an1 are detected.

With a signal from the voltage level detection circuit 50, the voltage control circuit 60 which judges direct control of a voltage outputted from the voltage conversion amplifying transistor Q13a per column designates a period of detecting charges from the photoelectric transducer PD to the noise signal elimination circuit 40 during the horizontal blanking period as a necessary operation period. However, the voltage control circuit 60 designates the period other than the necessary operation period as a non-operation state.

Therefore, it is possible to immediately judge an output signal of a photoelectric transducer while reducing the power consumption, and to correct a voltage of the common column signal line either to a voltage outputted from an amplifying circuit or to a voltage corresponding to a reset voltage of the photoelectric transducer.

SECOND EMBODIMENT

Next, a specific example of the voltage level detection circuit 50 shown in FIG. 10 is described in details.

Figure 13:
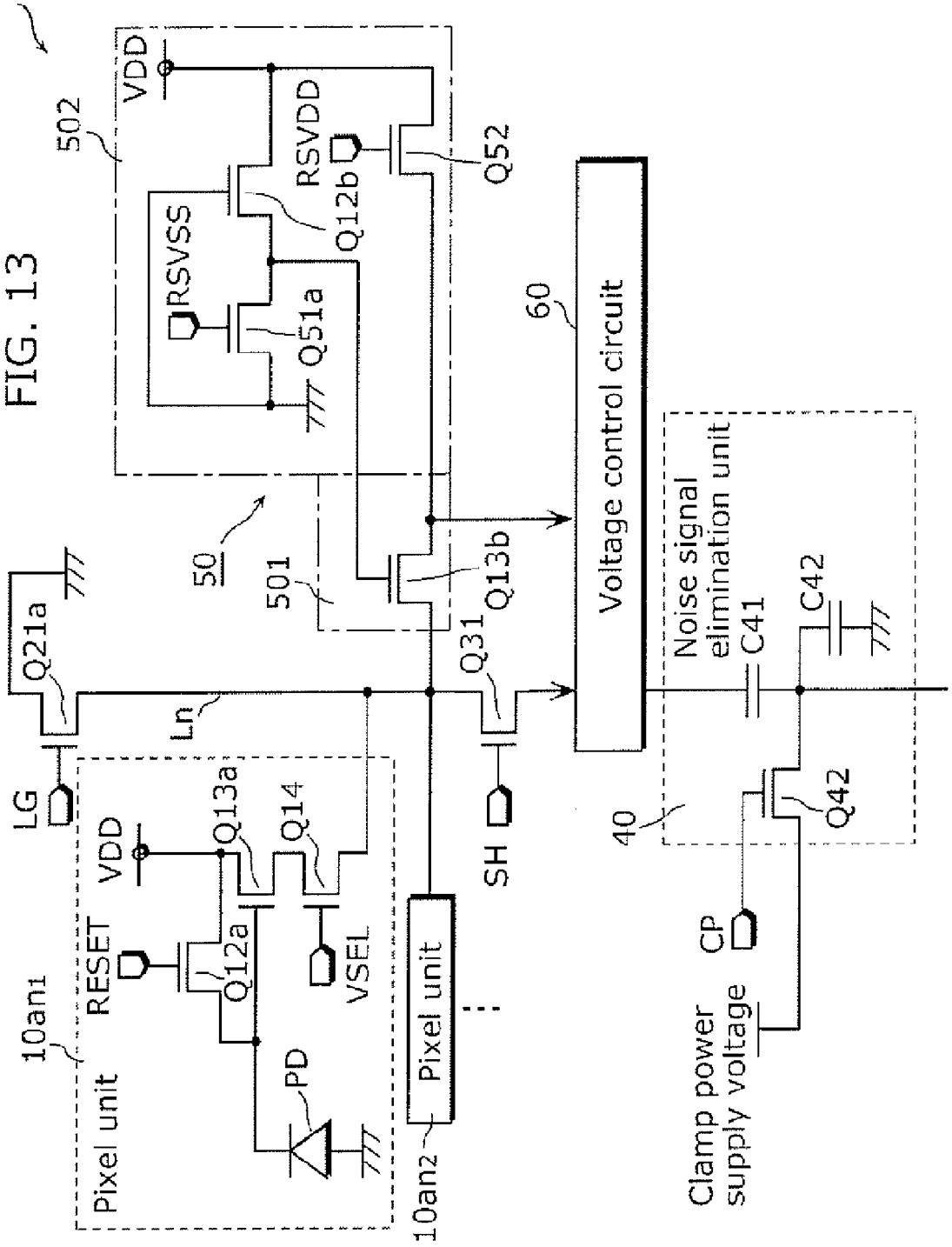
FIG. 13 is a diagram showing a circuit configuration of the MOS solid-state imaging device 2 which embodies a voltage level detection circuit 50.

FIG. 13 is a diagram showing a circuit configuration of a MOS solid-state imaging device 2 which embodies a voltage level detection circuit 50. Note that the schematic representations of the horizontal output circuit 90 and the like are omitted in the diagram.

The voltage level detection circuit 50 includes an individual unit 501 provided per column and a common unit 502 which is commonly provided per MOS solid-state imaging device.

The common unit 502 includes: a saturation voltage generation reset transistor Q51a; a reset transistor Q12b fabricated in the same method as and having the same size as the reset transistor Q12a of the pixel unit 10an1; and a voltage control circuit input unit reset transistor Q52, and functions as a saturation voltage generation unit which generates a potential identical to the saturation voltage of the photoelectric transducer PD.

The individual unit 501 includes a voltage level detection transistor Q13b fabricated in the same method as and having the same size as the voltage conversion amplifying transistor Q13a of the pixel unit 10an1, and functions as a judging circuit which judges whether or not high-luminance light is entered in the photoelectric transducer PD, based on the voltage outputted from the voltage conversion amplifying transistor Q13a to the common column signal line and the voltage corresponding to the potential identical to the saturation voltage generated by the common unit 502.

The drain of the voltage level detection transistor Q13b is connected to the common column signal line Ln, the source is connected to the input of the voltage control circuit 60, and the voltage level generated by the saturation voltage generation reset transistor Q51a and the reset transistor Q12b is inputted to the gate.

Next, the charge detection operation of the MOS solidstate imaging device 2 is described. Note that the charge detection operation in the pixel unit 10an1 is described in particular.

Figure 14:
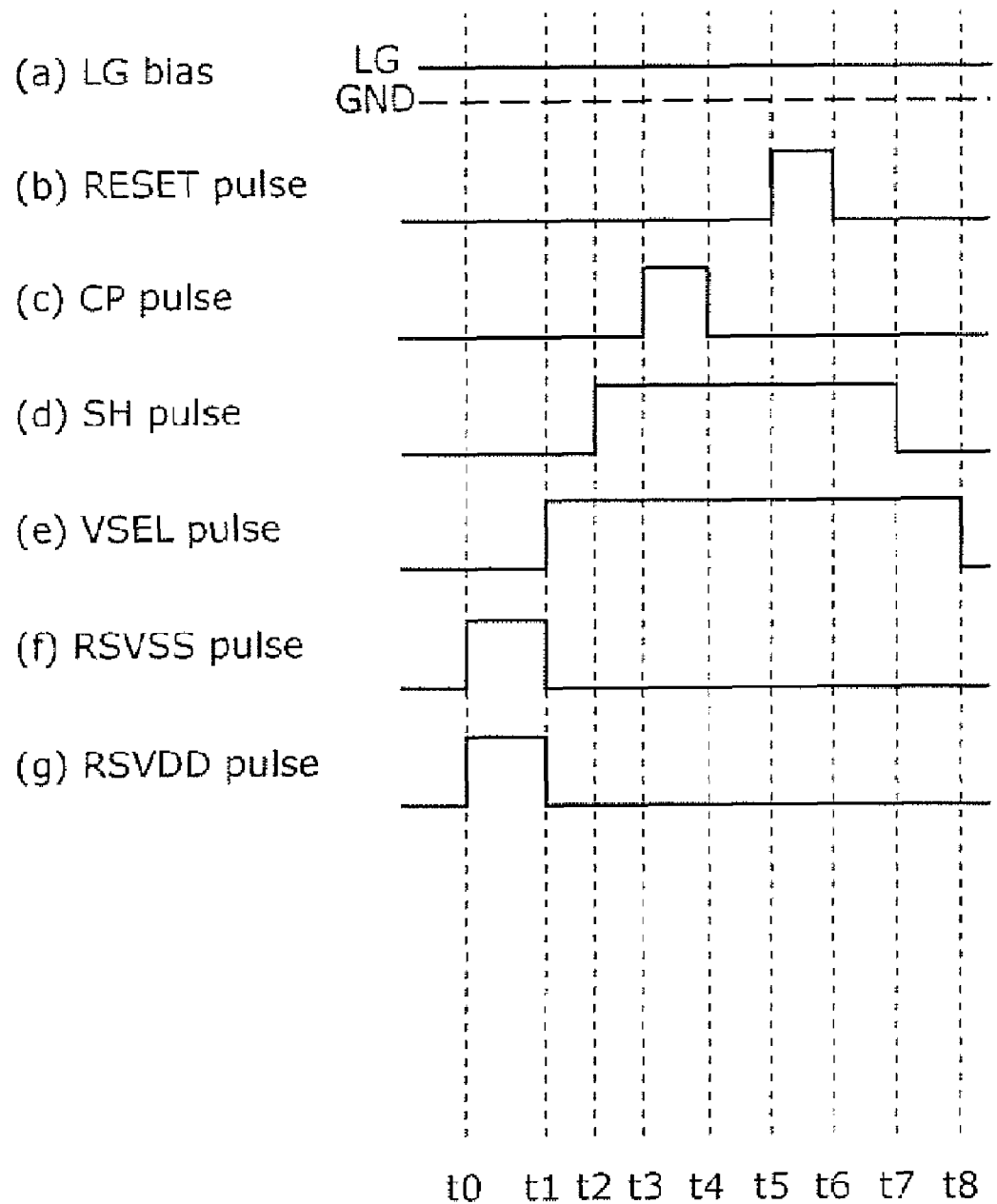
FIG. 14 is a diagram showing drive timing of the MOS solid-state imaging device 2 shown in FIG. 13.

FIG. 14 is a diagram showing drive timing of the MOS solid-state imaging device 2 shown in FIG. 13.

As for the timing, before the operation of detecting the accumulated charges in the pixel unit 10an1 on or after the time t1, at the time t0, an RSVSS pulse turns on the saturation voltage generation reset transistor Q51a and an RSVDD pulse turns on the voltage control circuit input unit reset transistor Q52.

With this, the saturation voltage of the photoelectric transducer PD is inputted in the gate of the voltage level detection transistor Q13b, and the voltage of the power supply voltage VDD is inputted in the source.

When the VSEL pulse turns on the row selection transistor Q14 of the pixel unit 10an1 at the time t1, a signal appears in the common column signal line Ln via the voltage conversion amplifying transistor Q13a of the pixel unit 10an1. However, when high-luminance incident light is inputted, the voltage level outputted to the common column signal line Ln is extremely lowered, and the charges pass the gate of the voltage level detection transistor Q13b. As a result, although the source potential of the voltage level detection transistor Q13b, in other words, the voltage inputted to the voltage control circuit 60 has been the power supply voltage VDD (high according to the logic level), it becomes equivalent to the voltage level outputted to the common column signal line Ln and is changed to the low potential according to the logic level.

The voltage control circuit 60 detects this change at a latter stage, and starts the correction operation.

Here, the reason why the voltage level inputted to the gate of the voltage level detection transistor Q13b is identical to the level determined when the gate of the reset transistor Q12a which resets the photoelectric transducer PD is turned off is because the voltage level when charges are accumulated in the photoelectric transducer PD in the case where high-luminance incident light is inputted is determined, depending on a threshold value when the gate of the reset transistor Q12a is turned off, and the voltage level is not lowered beyond the threshold value. In the case where the drain is the power supply voltage VDD and the source is a floating node, the voltage level corresponds to the source potential determined when the gate of the reset transistor Q12a is turned off. With this, as a voltage level can be detected without wasting saturation charges accumulated in the photoelectric transducer PD, it is possible to fully use a high dynamic range of the photoelectric transducer PD.

Furthermore, assuming that variations in threshold values of a transistor arise in a manufacturing process, when the gate of the reset transistor Q12a inputted in the voltage level detection circuit 50 is turned off and the saturation voltage is generated, another group of photoelectric transducers PDs is provided separately from the two-dimensional imaging region. As a result, it becomes possible to input the voltage level identical to the photoelectric transducer PD in the two-dimensional imaging region, and to accurately judge whether or not high-luminance incident light is entered, regardless of the variations in threshold values of the transistor, which inevitably arise in a manufacturing process.

THIRD EMBODIMENT

Next, a specific example of the voltage control circuit 60 shown in FIG. 10 is described in details.

Figure 15:
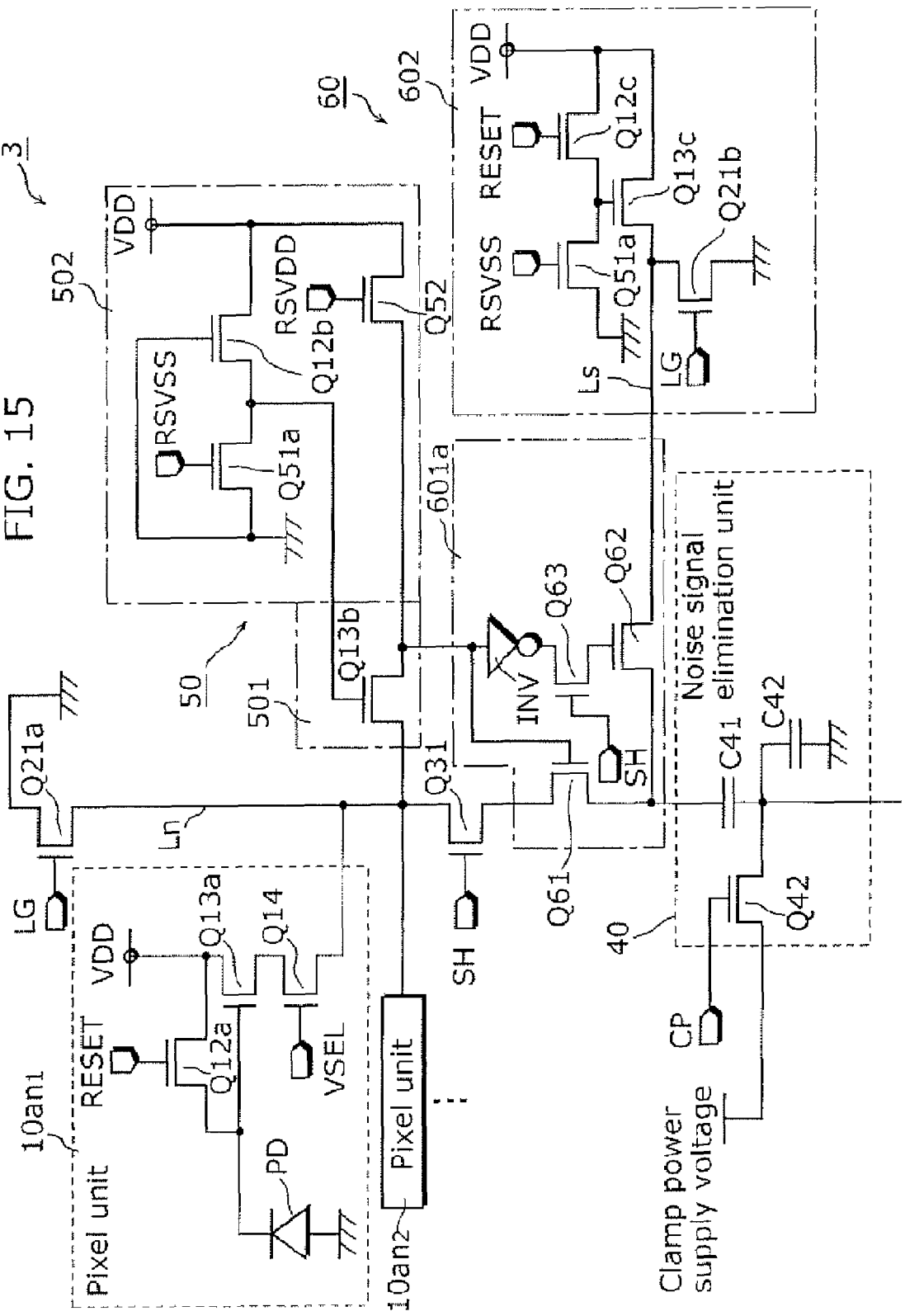
FIG. 15 is a diagram showing a circuit configuration of the MOS solid-state imaging device 3 which embodies the voltage control circuit 60.

FIG. 15 is a diagram showing a circuit configuration of a MOS solid-state imaging device 3 which embodies the voltage control circuit 60. Note that the schematic representations of the horizontal output circuit 90 and the like are omitted in the diagram.

The voltage control circuit 60 includes an individual unit 601*a* provided per column and a common unit 602 which is commonly provided per MOS solid-state imaging device.

The common unit 602 includes: a reset transistor Q12*c* for generating a reset voltage, which is fabricated in the same method as and having the same size as the reset transistor Q12*a* of the pixel unit 10an1; a GND level setting transistor Q51*b* which resets charges to the GND level for generating a saturation voltage;

a detection transistor Q13*c* which designates the generated reset voltage or the saturation voltage as a gate; a load transistor Q21*b* which forms a source follower circuit. It functions as a reset in voltage generation circuit which generates a voltage identical to the voltage level of the common column signal line Ln in which a reset voltage of the photoelectric transducer PD is outputted. The individual unit 601*a* includes: a common column signal line connection transistor Q61 in which a gate is changed to low level by the entered high-luminance incident light; an inverter circuit in which a source of the voltage level detection transistor Q13*b* is used as the input; a correction signal line connection transistor Q62 which uses an output of the inverter circuit as the gate and connects the common column signal line Ln to the correction signal line Ls which is outputted from the detection transistor; and a transistor Q63 which connects the gate of the correction signal line connection transistor Q62 to an output of the inverter circuit INV. It functions as a replacement circuit which replaces a reset voltage of the photoelectric transducer PD by inputting, in the common column signal line Ln, the voltage identical to the voltage generated by the common unit 602.

Figure 16:
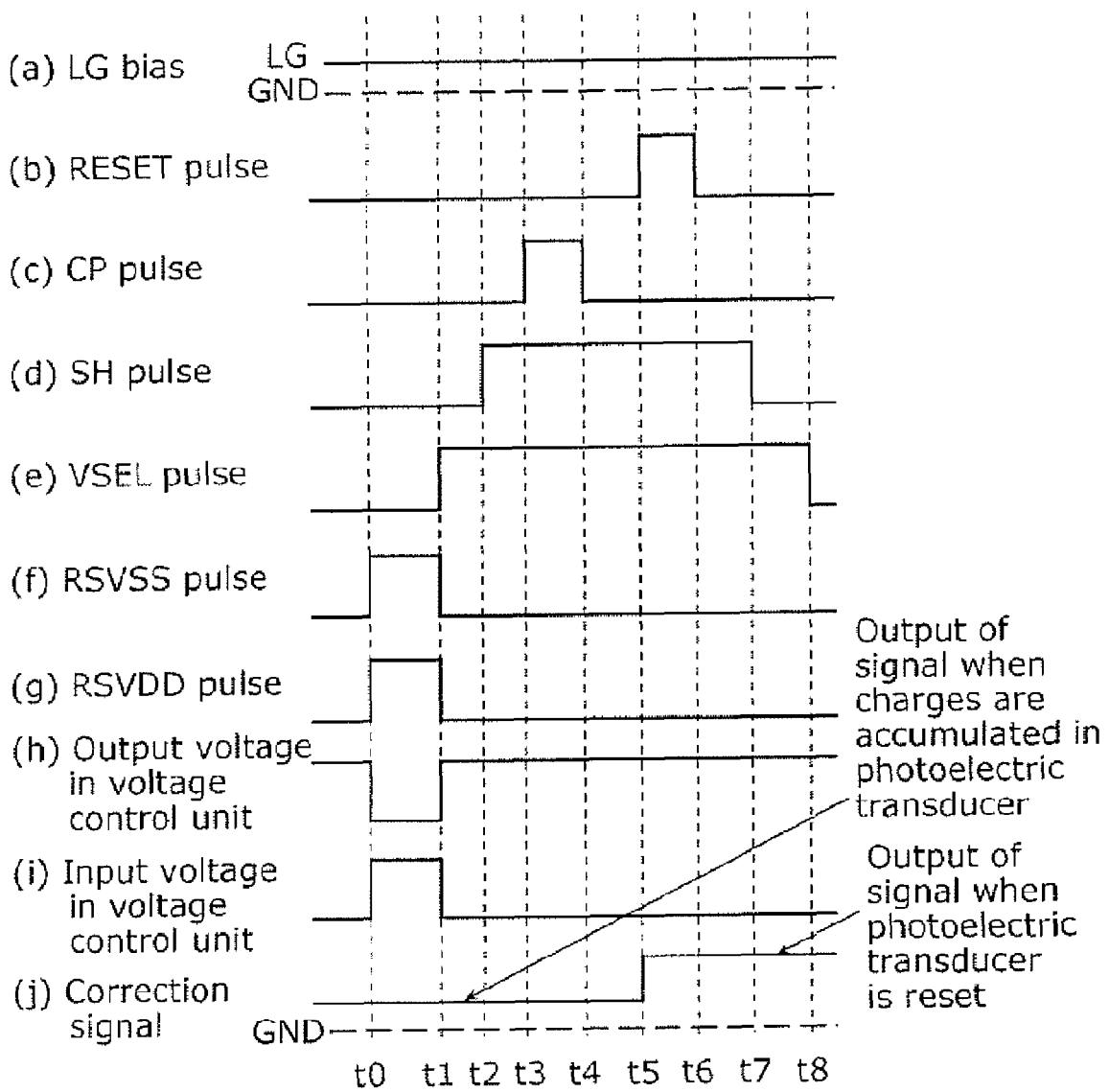
FIG. 16 is a diagram showing drive timing of the MOS solid-state imaging device 3 shown in FIG. 15.

FIG. 16 is a diagram showing drive timing of the MOS solid-state imaging device 3 shown in FIG. 15.

As for the timing when high-luminance incident light is entered, at the time t0, the RSVSS pulse turns on the saturation voltage generation reset transistor Q51*a* and the GND level setting transistor Q51*b*. With this, the voltage identical to the voltage of the common column signal line Ln in which the saturation voltage of the photoelectric transducer PD is outputted is set in the correction signal line Ls.

When the VSEL pulse turns on the row selection transistor Q14 of the pixel unit 10an1 at the time t1, a signal appears in the common column signal line Ln via the voltage conversion amplifying transistor Q13*a* of the pixel unit 10an1. However, when high-luminance incident light is inputted, as described above, although the voltage inputted to the voltage control circuit 60 has been the power supply voltage VDD (high according to the logic level), it becomes equivalent to the voltage level outputted to the common column signal line Ln and is changed to the low potential according to the logic level. With this, through the inverter circuit INV at a latter stage, a voltage control circuit output voltage (a gate of the correction signal line connection transistor Q62) is changed to the high potential according to the logic level, and connects the correction signal line Ls to the common column signal line Ln In this case, as the gate of the common column signal line connection transistor Q61 is simultaneously changed to the low level due to the entered high-luminance light, the voltage outputted from the two-dimensional imaging region to the common column signal line Ln is interrupted. At this point, the voltage of the correction signal line Ls, in other words, the voltage identical to the voltage of the common column signal line Ln in which the saturation voltage of the photoelectric transducer PD is outputted is inputted into the noise signal elimination circuit 40 as a replacement for the initial voltage outputted to the common column signal line Ln.

At the time t3, the CP pulse within the noise signal elimination circuit 40 clamps the voltage as an accumulated signal. Then, at the time t5 when the reset level of the photoelectric transducer PD is detected, the voltage identical to the voltage level of the common column signal line Ln in which the reset voltage of the photoelectric transducer PD is outputted is set in the correction signal line Ls by turning on the reset transistors Q12*a* and Q12*c* with the RESET pulse. The initial voltage outputted to the common column signal line Ln is replaced with the generated output voltage, and is inputted into the noise signal elimination circuit 40.

On or after the time t6, the correlated double sampling is performed within the noise signal elimination circuit 40 so that the charges of the photoelectric transducer PD in which noise is eliminated can be normally detected.

As described above, the voltage identical to the common column signal line Ln in which the saturation voltage and the reset voltage of the photoelectric transducer PD are outputted is generated in the correction signal line Ls. This is because the voltage level corresponding to the charges accumulated in the photoelectric transducer PD after the charges become saturated is determined depending on the threshold value when the gate of the reset transistor is turned off, and the voltage level corresponding to the charges accumulated in the photoelectric transducer PD after the photoelectric transducer PD is reset is determined depending on the threshold value when the gate of the reset transistor is turned on.

Furthermore, assuming that variations in threshold values of a transistor arise in a manufacturing process, another group of photoelectric transducers PDs is provided separately from the two-dimensional imaging region so as to generate the saturation voltage of the photoelectric transducer PD and the voltage identical to the voltage of the common column signal line Ln in which the reset voltage is outputted. Thus, it is possible to input the completely identical voltage level as the photoelectric transducer PD within the two-dimensional imaging region, and to input the accurate voltage level regardless of the variations in threshold values of the transistor, which inevitably arise in a manufacturing process.

FOURTH EMBODIMENT

The aforementioned voltage control circuit 60 can reduce the power consumption by operating it during a charge detection period of detecting charges from the photoelectric transducer PD to the noise signal elimination circuit 40 during the horizontal blanking period, and by not operating it during a horizontal scanning period other than the aforementioned period. This specific example is shown in FIG. 17.

Figure 17:
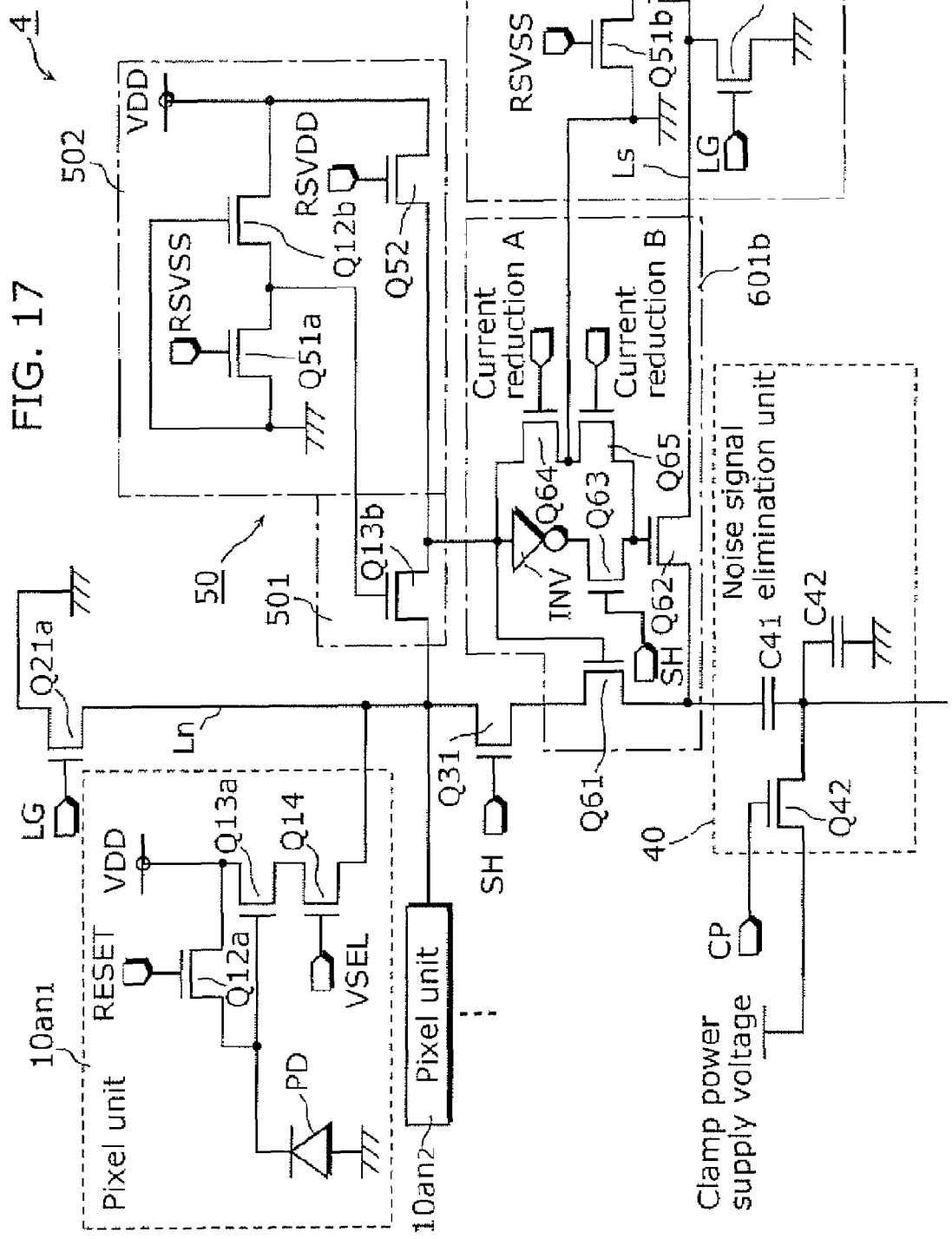
FIG. 17 is a diagram showing a circuit configuration of the MOS solid-state imaging device 4 which is aiming at reducing the power consumption of the voltage control circuit 60.

FIG. 17 is a diagram showing a circuit configuration of a MOS solid-state imaging device 4 which is aiming at reducing the power consumption of the voltage control circuit 60.

Note that the schematic representations of the horizontal output circuit 90 and the like are omitted in the diagram.

In addition to the configuration including the individual unit 601a, the individual unit 601b of the voltage control circuit 60 further includes: a current reduction transistor Q64 provided between the inverter circuit INV and the ground; and a current reduction transistor Q65 provided between the gate of the correction signal line connection transistor Q62 and the ground.

Figure 18:
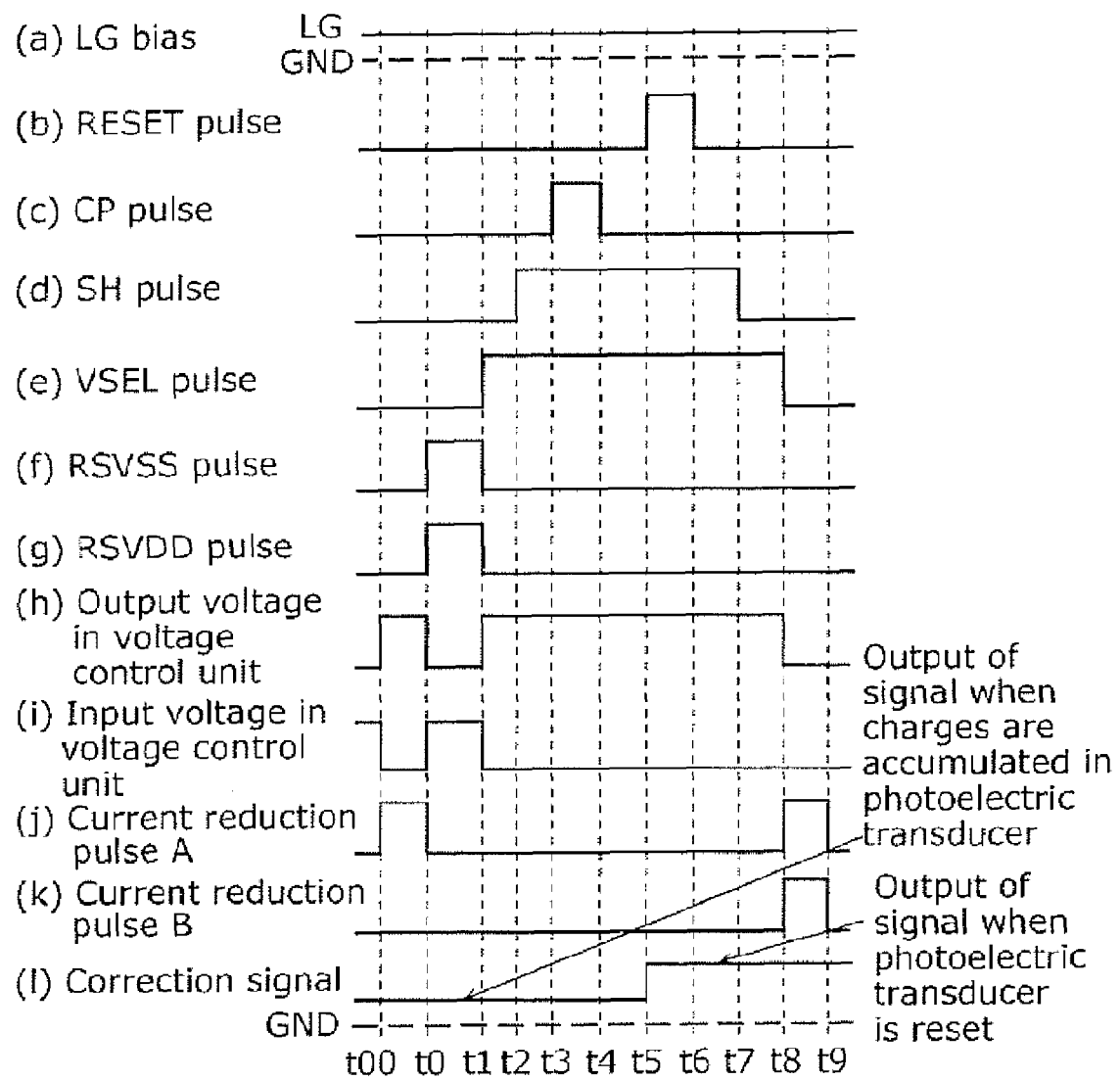
FIG. 18 is a diagram showing drive timing of the MOS solid-state imaging device 4 shown in FIG. 17.

FIG. 18 is a diagram showing drive timing of the MOS solid-state imaging device 4 shown in FIG. 17.

As for the timing when high-luminance incident light is entered, at the time t00, a voltage control circuit current reduction pulse A turns on the current reduction transistor Q64, making the input terminal of the voltage control circuit 60 low potential according to the logic level. With this, a current path of the inverter circuit INV at a latter stage is interrupted. Next from the time t0 to the time t8, after the charge detection operation in the photoelectric transducer PD in the first embodiment is completed, a voltage control circuit current reduction pulse B turns on the current reduction transistor Q65, making the voltage control circuit output voltage (the gate of the correction signal line connection transistor Q62) low potential according to the logic level. Then, the pulse B turns off the connection between the correction signal line Ls and the common column signal line Ln. Furthermore, the voltage control circuit current reduction pulse A turns on the current reduction transistor Q64, making the voltage control circuit input voltage (the source of the voltage level detection transistor Q13b) low potential according to the logic level. With this, the current path of the inverter circuit INV is interrupted. As a result, the current to be unnecessarily consumed can be eliminated.

FIFTH EMBODIMENT

A potential of a charge detection unit (floating diffusion) in an FDA-type solid-state imaging device having a function of transferring accumulated charges from the photoelectric transducer PD to the charge detection unit (floating diffusion) can be applied as a potential of the photoelectric transducer PD which converts the aforementioned incident light to charges.

Figure 19:
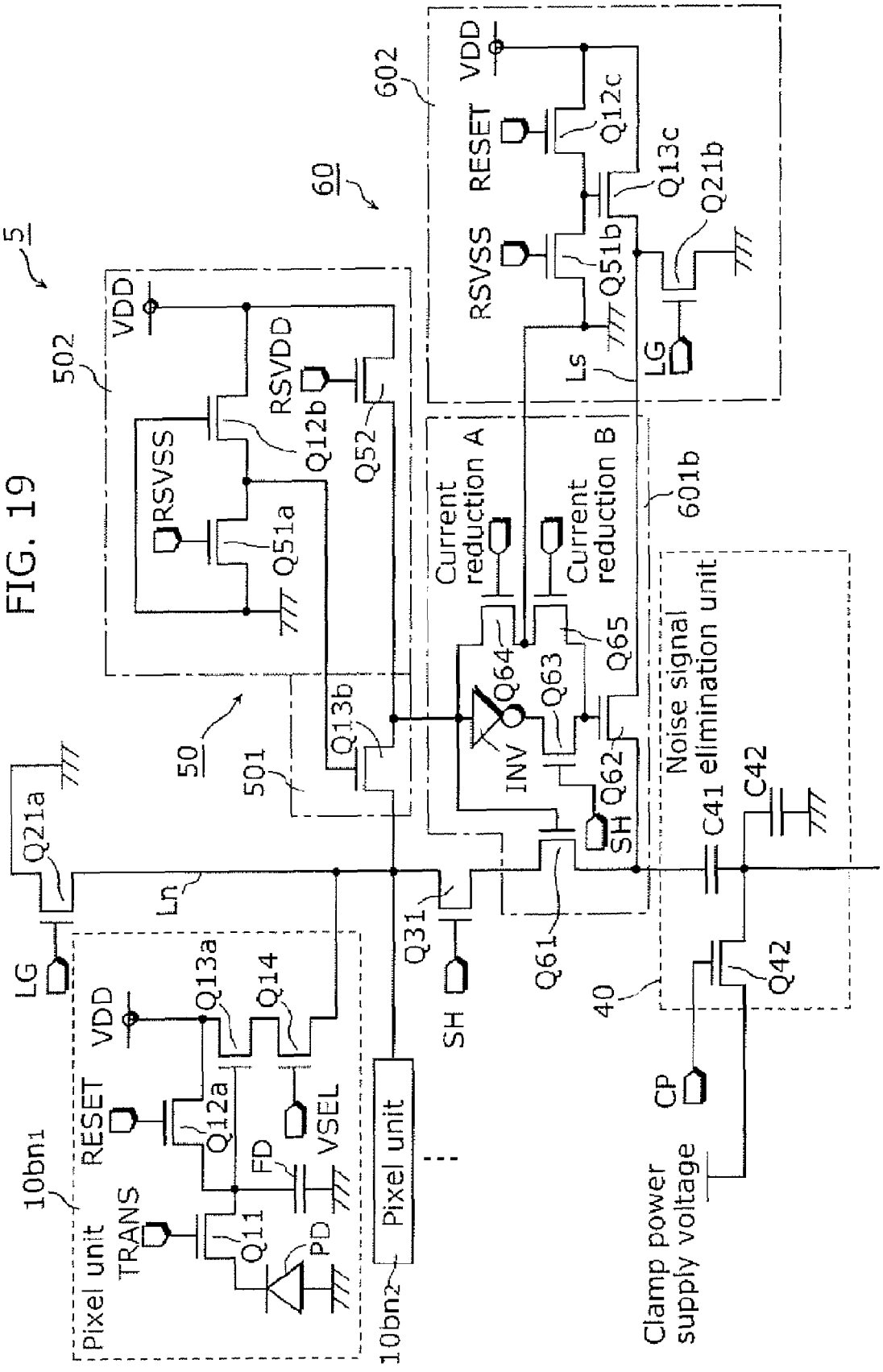
FIG. 19 is a diagram showing a circuit configuration of the FDA-type MOS solid-state imaging device 5.

A circuit diagram is shown in FIG. 19.

FIG. 19 is a diagram showing a circuit configuration of an FDA-type MOS solid-state imaging device 5. Note that the schematic representations of the horizontal output circuit 90 and the like are omitted in the diagram.

The diagram differs from FIG. 17 in that the pixel unit 10bn1 is changed from the AMI type to the FDA type.

In other words, the transfer transistor Q11 temporarily transfers the accumulated charges of the photoelectric transducer PD to the floating diffusion FD, and the voltage conversion amplifying transistor Q13a outputs the voltage corresponding to the potential of the floating diffusion FD.

Figure 20:
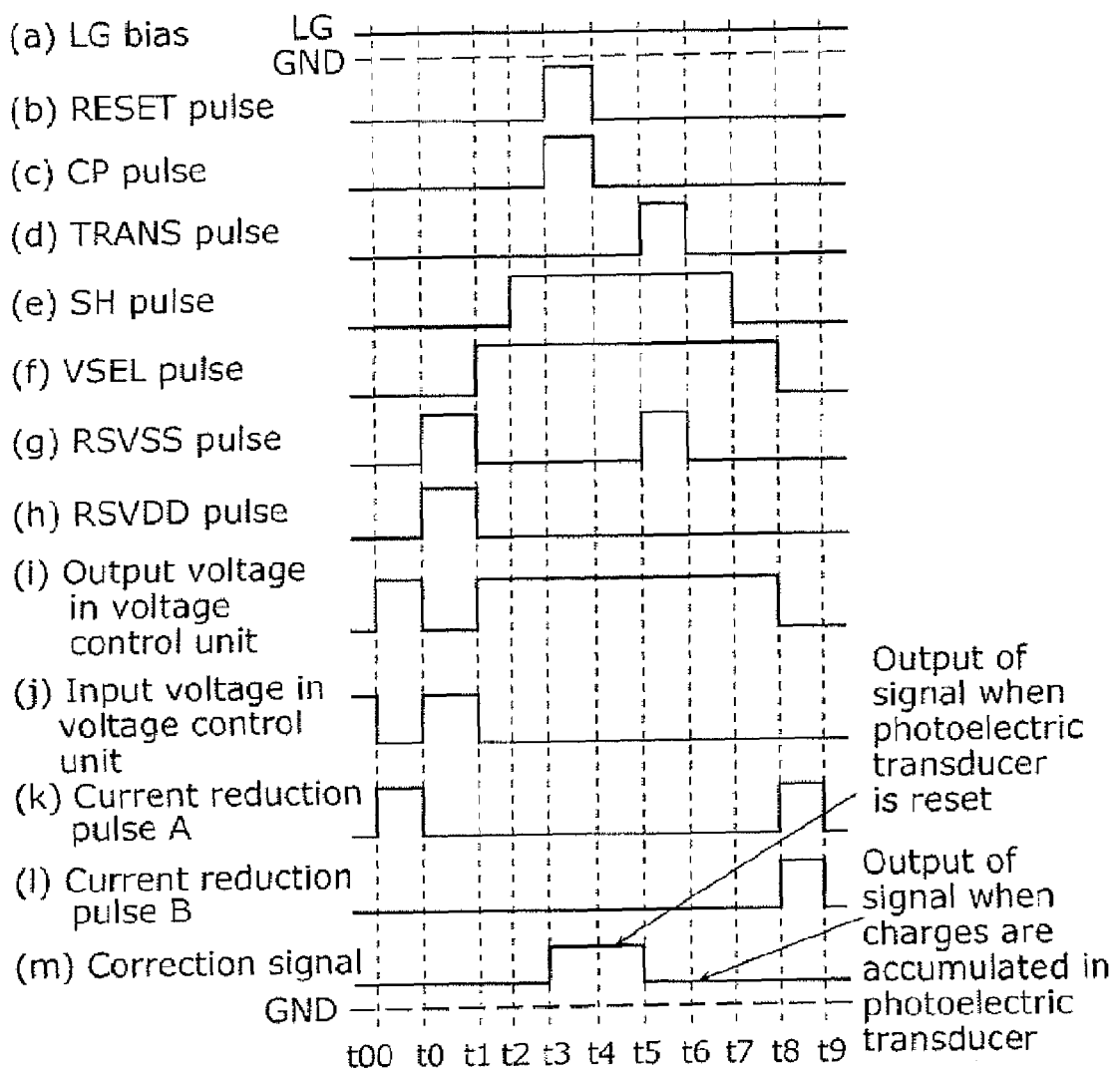
FIG. 20 a diagram showing drive timing of the MOS solid-state imaging device 5 shown in FIG. 19.

FIG. 20 shows timing when high-luminance incident light is entered.

At the time t00, the voltage control circuit current reduction pulse A turns on the current reduction transistor Q64, making the input terminal of the voltage control circuit 60 low potential according to the logic level. With this, the current path of the inverter circuit INV at a latter stage is interrupted.

Then, at the time t0, the RSVSS pulse and RSVDD pulse are turned on. With this, the saturation voltage of the photoelectric transducer PD is inputted into the gate of the voltage level detection transistor Q13b, and the power supply voltage VDD is inputted into the source. At the time t1, when the VSEL pulse of the pixel unit 10an1 turns on the row selection transistor Q14, a signal appears in the common column signal line Ln via the voltage conversion amplifying transistor Q13a of the pixel unit 10an1. Then, when high-luminance incident light is inputted, the voltage level outputted to the common column signal line Ln is extremely lowered, and the charges pass the gate of the voltage level detection transistor Q13b. As a result, although the source potential of the voltage level detection transistor Q13b, in other words, the voltage inputted to the voltage control circuit 60 has been the power supply voltage VDD (high according to the logic level), it becomes equivalent to the voltage level outputted to the common column signal line Ln and is changed to the low potential according to the logic level. As the voltage control circuit 60 at a latter stage detects this change, the voltage control circuit output voltage becomes high according to the logic level, and the voltage of the correction signal line Ls is connected to the common column signal line Ln. In this case, as the gate of the common column signal line connection transistor Q61 is simultaneously changed to the low level due to the entered high-luminance light, the voltage outputted from the two-dimensional imaging region to the common column signal line Ln is interrupted. At the time t3, when the RESET pulse turns on the reset transistors Q12a and Q12c, the voltage of the correction signal line Ls, in other words, the voltage identical to the voltage of the common column signal line in which the reset voltage of the photoelectric transducer PD is outputted is inputted into the noise signal elimination circuit 40 as a replacement for the initial voltage outputted to the common column signal line Ln. At the time t3, the CP pulse within the noise signal elimination circuit 40 clamps the voltage as a reset signal, and then at the time t5 when the accumulated signal level of the photoelectric transducer PD is detected, the RSVSS pulse turns on the saturation voltage generation reset transistor Q51a and the GND level setting transistor Q51b. Consequently, the voltage identical to the voltage of the common column signal line Ln in which the saturation voltage of the photoelectric transducer PD is outputted is set in the correction signal line Ls, and is inputted into the noise signal elimination circuit 40 as a replacement for the initial voltage outputted to the common column signal line Ln. On or after the time t6, the correlated double sampling is performed within the noise signal elimination circuit 40 so that the charges of the photoelectric transducer PD in which noise is eliminated can be normally detected.

SIXTH EMBODIMENT

A reset voltage of a charge detection unit (floating diffusion) in an FDA-type solid-state imaging device having a function of transferring accumulated charges from the photoelectric transducer PD to the charge detection unit (floating diffusion) can be applied as a potential of the photoelectric transducer PD which converts the aforementioned incident light to charges.

Figure 21:
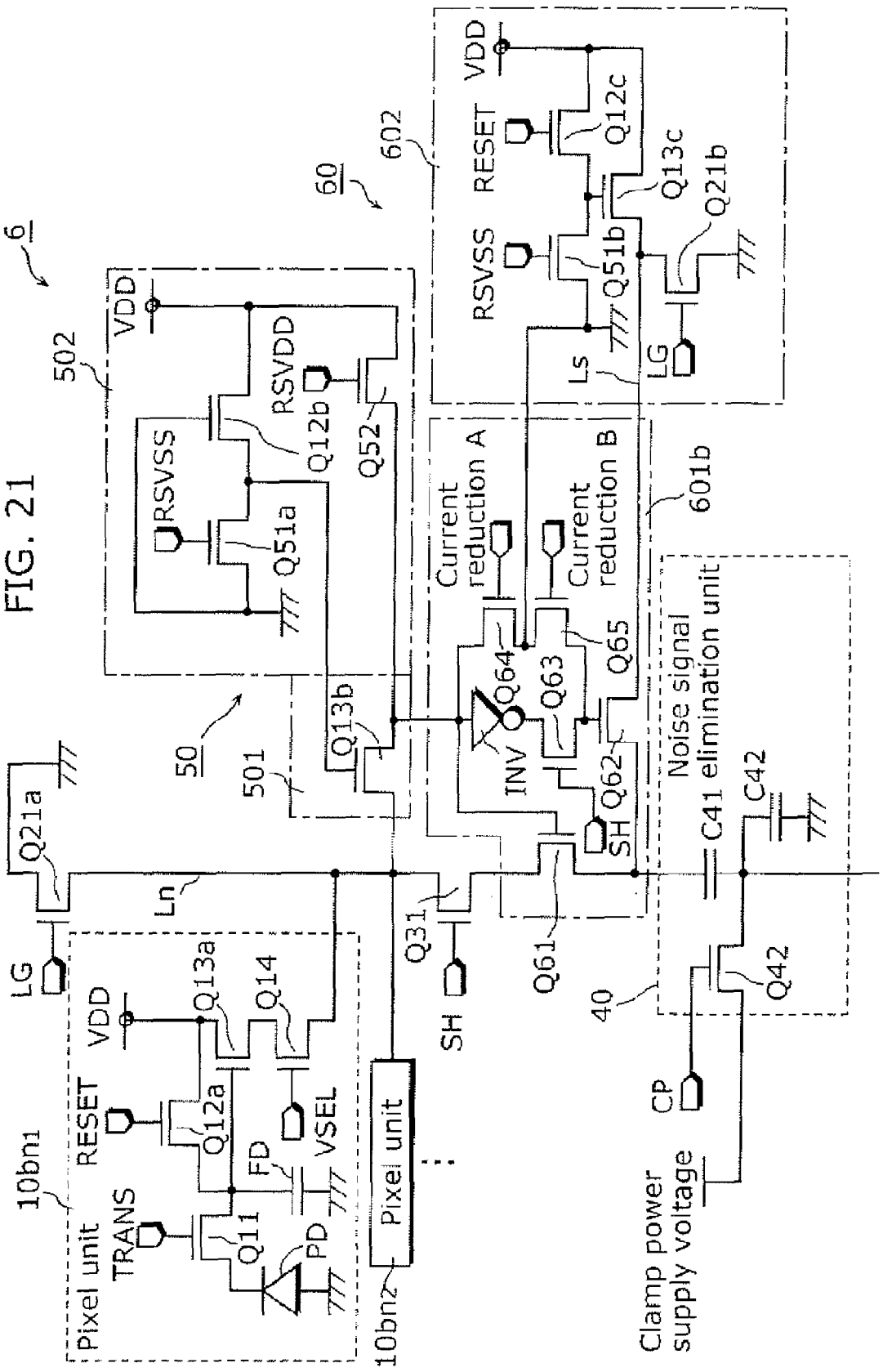
FIG. 21 is a diagram showing a circuit configuration of the FDA-type MOS solid-state imaging device 6.

A circuit diagram is shown in FIG. 21.

FIG. 21 is a diagram showing a circuit configuration of an FDA-type MOS solid-state imaging device 6. Note that the schematic representations of the horizontal output circuit 90 and the like are omitted in the diagram.

The difference with the MOS solid-state imaging device 4 is that the pixel unit is changed from the AMI type to the FDA type. In other words, in the pixel unit 10bn1, the transfer transistor Q11 temporarily transfers the accumulated charges in the photoelectric transducer PD to the floating diffusion FD, and the potential of the floating diffusion FD is converted to the voltage by the voltage conversion amplifying transistor Q13a so as to output the voltage.

Figure 22:
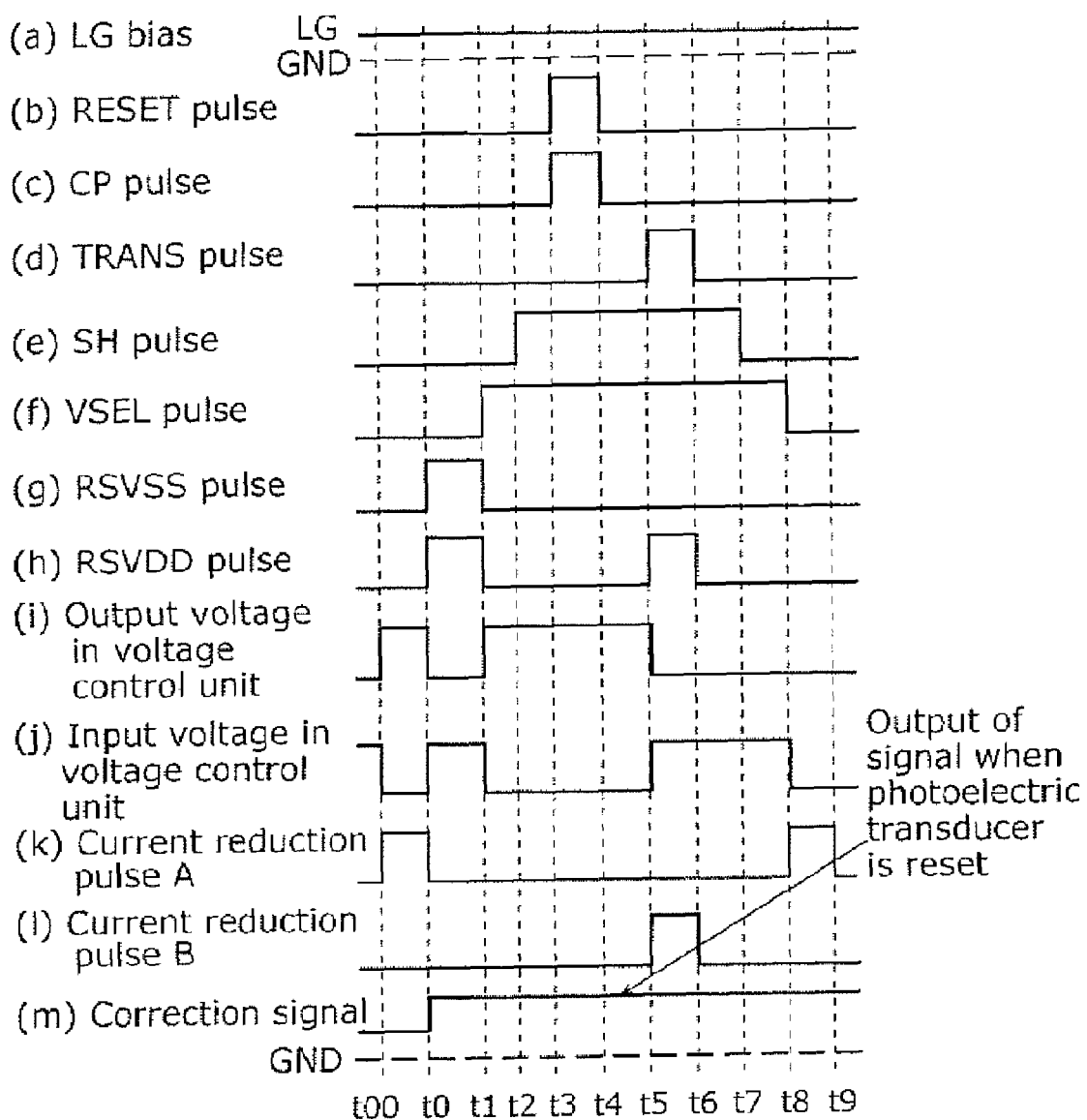
FIG. 22 is a diagram showing drive timing of the MOS solid-state imaging device 5 shown in FIG. 21.

FIG. 22 shows the timing when high-luminance incident light is entered.

At the time t00, the voltage control circuit current reduction pulse A turns on the current reduction transistor Q64, making the input terminal of the voltage control circuit 60 low potential according to the logic level. With this, the current path of the inverter circuit INV at a latter stage is interrupted. Then, at the time t0, the RSVSS pulse and RSVDD pulse are turned on. With this, the saturation voltage of the photoelectric transducer PD is inputted into the gate of the voltage level detection transistor Q13b, and the power supply voltage VDD is inputted into the source. At the time t1, when the VSEL pulse turns on the row selection transistor Q14 of the pixel unit 10bn1, a signal appears in the common column signal line Ln via the voltage conversion amplifying transistor Q13a of the pixel unit 10bn1. However, when high-luminance incident light is inputted, the voltage level outputted to the common column signal line Ln is extremely lowered, and the charges pass the gate of the voltage level detection transistor Q13b. As a result, although the source potential of the voltage level detection transistor Q13b, in other words, the voltage inputted to the voltage control circuit 60 has been the power supply voltage VDD (high according to the logic level), it becomes equivalent to the voltage level outputted to the common column signal line Ln and is changed to the low potential according to the logic level. As the voltage control circuit 60 at a latter stage detects this change, the voltage control circuit output voltage becomes high according to the logic level, and connects the voltage of the correction signal line Ls to the common column signal line Ln. In this case, the voltage identical to the common column signal line Ln, in which the reset voltage of the photoelectric transducer PD is outputted, is outputted to the common column signal line Ln. In this case, as the gate of the common column signal line connection transistor Q61 is simultaneously changed to the low level due to the entered high-luminance light, the voltage outputted from the two-dimensional imaging region to the common column signal line Ln is interrupted. At the time t3, the voltage of the correction signal line Ls, in other words, the voltage identical to the voltage of the common column signal line Ln in which the reset voltage of the photoelectric transducer PD is outputted is inputted into the noise signal elimination circuit 40 as a replacement for the initial voltage outputted to the common column signal line Ln. At the time t3, the CP pulse within the noise signal elimination circuit 40 clamps the voltage as a reset signal, and then at the time t5 when the accumulated signal level of the photoelectric transducer PD is detected, by turning on the RSVDD pulse, the voltage inputted to the voltage control circuit 60 becomes equivalent to the voltage of the power supply voltage VDD (high according to the logic level). As the gate of the common column signal line connection transistor Q61 is changed to the high level, the voltage control circuit 60 connects the voltage of the correction signal line Ls to the output of the common column signal line Ln from the two-dimensional imaging region. At this time, the voltage control circuit current reduction pulse B turns on the current reduction transistor Q65, making the voltage control circuit output voltage low potential according to the logic level. Then, the connection between the correction signal line Ls and the common column signal line Ln is interrupted. With this, the voltage of the common column signal line Ln in which the saturation voltage of the photoelectric transducer PD is outputted from the two-dimensional imaging region is inputted to the noise signal elimination circuit 40. On or after the time t6, the correlated double sampling is performed within the noise signal elimination circuit 40 so that the charges of the photoelectric transducer PD in which noise is eliminated can be normally detected.

Note that the camera according to the present invention is configured including the solid-state imaging devices shown in the aforementioned first to sixth embodiments, the lenses and the like, and it has the configurations, functions and effects as described above.

Figure 23:
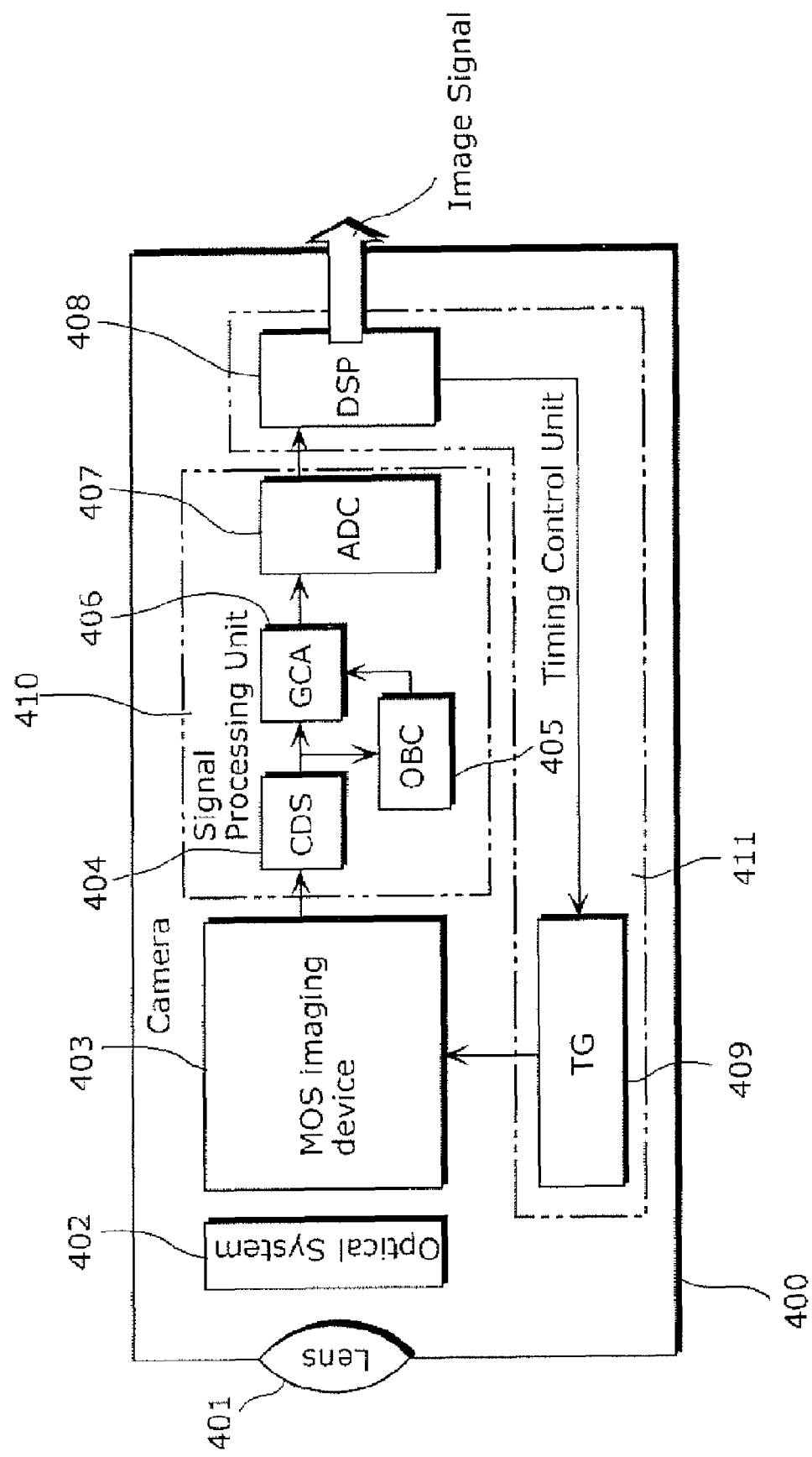
FIG. 23 is a diagram showing a configuration of a camera using the solid-state imaging devices of the first to sixth embodiments.

FIG. 23 is a diagram showing the configuration of a camera using the solid-state imaging devices of the aforementioned first to sixth embodiments.

As shown in FIG. 23, a camera 400 is comprised of: a lens 401 for providing an optical image of a subject on an imaging device; an optical system 402, such as a mirror and a shutter for performing optical processing for the optical image which has passed through the lens 401; a MOS imaging device 403 which is realized by the aforementioned solid-state imaging devices; a signal processing unit 410; a timing control unit 411; and the like. The timing control unit 411 is comprised of: a CDS circuit 404 for obtaining a difference between the output signal and a field through signal which is outputted from the MOS imaging device 403; an OB clamp circuit 405 for detecting an OB level signal which is outputted from the CDS circuit 404; a GCA 406 for obtaining a difference between the OB level and a signal level of an effective pixel and adjusting a gain of the difference; an ADC 407 for converting an analog signal outputted from the GCA 406 to a digital signal; and the like. The timing control unit 411 is comprised of: a DSP 408 for performing signal processing on the digital signal outputted from the ADC 407, and controlling drive timings; a TG 409 for generating, at various timings, various kinds of drive pulses for the MOS imaging device 403 according to instructions from the DSP 408; and the like.

According to the camera 400 having the above described configuration, using the MOS imaging device 403 realized by the above solid-state imaging devices, it is possible to realize a camera, which can provide high-resolution images, which can immediately judge an output signal level of a pixel unit within a solid-state imaging device and can correct a signal when high-luminance incident light is entered.

Note that in the aforementioned description, the type of the solid-state imaging device is assumed to be a MOS type, however it may be a CCD type.

INDUSTRIAL APPLICABILITY

Using the MOS solid-state imaging device according to the present invention, a phenomenon does not occur in which, when a subject is captured with a high-luminance light, such as sunlight, for a background, a portion of the high-luminance subject is detected as a no-signal level, and a natural image can be generated even when a subject is captured in high-speed continuous-exposure mode to generate the multiple pixel images. The present invention can be applied to video cameras, digital cameras, and cameras installed in personal digital assistants (PDA), such as cellular phones and the like, each of which is equipped with this MOS solid-state imaging device.

The invention claimed is:

1. A solid-state imaging device comprising:
pixel units which are arranged one-dimensionally or two-dimensionally;
a voltage level detector operable to detect a pixel output voltage output from each of said pixel units to a common column signal line, and to generate a logic output voltage corresponding to the detected pixel output voltage; and a column signal processor operable to receive the pixel output voltage and the logic output voltage, and to output, to a horizontal output unit, one of a first voltage corresponding to the pixel output voltage and a second voltage, based on the logic output voltage;

wherein said column signal processor includes a noise signal eliminator operable to receive the pixel output voltage as an input, and to output, as the first voltage to the horizontal output unit, a difference between the pixel output voltage generated when each of said pixel units is reset and the pixel output voltage generated when charges are accumulated in each of said pixel units.

2. The solid-state imaging device according to claim 1, wherein each of said pixel units includes:

a photoelectric transducer which converts incident light into charges; and an amplifier operable to output, to the common column signal line, the pixel output voltage indicating an amount of the charges accumulated in said photoelectric transducer.

3. The solid-state imaging device according to claim 1, wherein said column signal processor further includes a voltage controller operable to supply a predetermined reset voltage to said noise signal eliminator, when said column signal processor outputs the second voltage, and said noise signal eliminator is operable to output, as the second voltage to the horizontal output unit, a difference between the predetermined reset voltage and the pixel output voltage generated when the charges are accumulated in each of said pixel units.

4. The solid-state imaging device according to claim 3, wherein said voltage controller includes:

a reset voltage generator operable to generate the predetermined reset voltage identical to the pixel output voltage generated when each of said pixel units is reset; and a replacement unit operable to supply the predetermined reset voltage to the common column signal line, the reset voltage being generated by said reset voltage generator.

5. The solid-state imaging device according to claim 4, wherein said reset voltage generator is formed outside each of said pixel units, and said replacement unit is provided per common column signal line.

6. The solid-state imaging device according to claim 3, wherein said voltage controller is operable to set, as an operation period, a period of detecting charges from each of said pixel units to said noise signal eliminator during a horizontal blanking period, and to set, as a non-operation period, a period other than said operation period.

7. The solid-state imaging device according to claim 3, wherein each of said pixel units includes a floating diffusion, and the predetermined reset voltage is used as a voltage when said floating diffusion is reset.

8. The solid-state imaging device according to claim 1, wherein said column signal processor further includes a voltage controller operable to generate a predetermined saturation voltage, and said column signal processor is operable to output the predetermined saturation voltage to the horizontal output unit as the second voltage.

9. The solid-state imaging device according to claim 8, wherein said voltage controller is operable to set, as an operation period, a period of detecting charges from each of said pixel units to said noise signal eliminator during a horizontal blanking period, and to set, as a non-operation period, a period other than said operation period.

10. The solid-state imaging device according to claim 8, wherein each of said pixel units includes a floating diffusion, and the predetermined saturation voltage is used as a voltage when said floating diffusion becomes saturated.

11. The solid-state imaging device according to claim 1, wherein said voltage level detector includes:

a saturation voltage generator operable to generate a saturation voltage identical to the pixel output voltage generated when the accumulated charges become saturated in each of said pixel units; and a judgment unit operable to compare, with the pixel output voltage, the saturation voltage generated by said saturation voltage generator, and to output the logic output voltage corresponding to a result of the comparison.

12. The solid-state imaging device according to claim 11, wherein said saturation voltage generator is formed outside each of said pixel units, and said judgment unit is provided per common column signal line.

13. A camera comprising the solid-state imaging device described in claim 1.

* * * * *

UNITED STATES PATENT AND TRADEMARK OFFICE
CERTIFICATE OF CORRECTION

PATENT NO. : 7,667,171 B2
APPLICATION NO. : 11/571461
DATED : February 23, 2010
INVENTOR(S) : Kasuga et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 511 days.

Signed and Sealed this

Seventh Day of December, 2010

David J. Kappos
*Director of the United States Patent and Trademark Office*